(12) United States Patent
Tang et al.

(10) Patent No.: US 8,446,767 B2
(45) Date of Patent: May 21, 2013

(54) MEMORIES AND THEIR FORMATION

(75) Inventors: Sanh D. Tang, Boise, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 375 days.

(21) Appl. No.: 12/829,860

(22) Filed: Jul. 2, 2010

(65) Prior Publication Data

US 2012/0002477 A1 Jan. 5, 2012

(51) Int. Cl.
*G11C 16/04* (2006.01)
(52) U.S. Cl.
USPC ............ 365/185.17; 365/185.33; 365/185.05
(58) Field of Classification Search
USPC .......................... 365/185.17, 185.33, 185.05
See application file for complete search history.

(56) References Cited

U.S. PATENT DOCUMENTS

| | | | |
|---|---|---|---|
| 7,112,815 B2 | 9/2006 | Prall | |
| 7,551,466 B2 | 6/2009 | Aritome | |
| 7,633,786 B2 | 12/2009 | Goda et al. | |
| 2001/0055838 A1 | 12/2001 | Walker et al. | |
| 2006/0146608 A1* | 7/2006 | Fasoli et al. | 365/185.17 |
| 2007/0023805 A1 | 2/2007 | Wells et al. | |
| 2008/0035905 A1 | 2/2008 | Parkinson | |
| 2008/0128780 A1 | 6/2008 | Nishihara et al. | |
| 2009/0230454 A1 | 9/2009 | Pekny | |
| 2009/0303795 A1* | 12/2009 | Morton et al. | 365/185.17 |
| 2010/0155803 A1 | 6/2010 | Sandhu | |
| 2010/0187660 A1 | 7/2010 | Tang | |
| 2010/0213578 A1 | 8/2010 | Sandhu | |

OTHER PUBLICATIONS

Tang, et al., *Semiconductor-Metal-on-Insulator Structures, Methods of Forming Such Structures, and Semiconductor Devices Including Such Structures*, U.S. Appl. No. 12/715,704, filed Mar. 2, 2010.
Tang, et al. *Semiconductor Devices Indluding a Diode Structure Over a Conductive Strap and Methods of Forming Such Semiconductor Devices*, U.S. Appl. No. 12/715,743, filed Mar. 2, 2010.
Tang, et al., *Floating Body Cell Structures, Devices Including Same, and Methods for Forming Same*, U.S. Appl. No. 12/715,843, filed Mar. 2, 2010.
Tang, et al. *Semiconductor Cells, Arrays, Devices and Systems Having a Buried Conductive Line and Methods for Forming the Same*, U.S. Appl. No. 12/715,922, filed Mar. 2, 2010.
Tang, et al., *Thyristor-Based Memory Cells Devices and Systems Including the Same and Methods for Forming the Same*, U.S. Appl. No. 12/715,889, filed Mar. 2, 2010.
"Three Dimensionally Stacked NAND Flash Memory Technology Using Stacking Single Crystal Si Layers on ILD and TANOS Structure for Beyond 30nm Node", Soon-Moon Jung, et al., R&D Center, Sam Sung Electronics, date unknown.
"DG-TFT-SONOS 3-D Flash" Schiltron Corporation, IEDM 2008.

* cited by examiner

*Primary Examiner* — Huan Hoang
(74) *Attorney, Agent, or Firm* — Leffert Jay & Polglaze, P.A.

(57) ABSTRACT

Memories and their formation are disclosed. One such memory has first and second memory cells at a first vertical level of the memory, first and second memory cells at a second vertical level of the memory, a first data line is selectively coupled to the first memory cells at the first and second vertical levels, and a second data line over the first data line is selectively coupled to the second memory cells at the first and second vertical levels.

38 Claims, 8 Drawing Sheets

MEMORIES AND THEIR FORMATION

FIELD

The present disclosure relates generally to memories and in particular, in one or more embodiments, the present disclosure relates to memories and their formation.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. Increasing the density of a flash memory device generally requires reducing spacing between memory cells and/or making memory cells smaller. Smaller dimensions of some device elements may cause operational problems with the cell. For example, the channel between the source/drain regions becomes shorter, possibly causing severe short channel effects.

One way of increasing the density of memory devices is to form stacked memory arrays, e.g., often referred to as three-dimensional memory arrays. For example, one type of three-dimensional memory array includes a plurality of traditional "two-dimensional" arrays, such as NAND memory arrays, stacked vertically one atop the other, with the memory cells of each memory array being silicon-on-sapphire transistors, silicon-on-insulator transistors, thin film transistors, thermoelectric polymer transistors, semiconductor-oxide-nitride-oxide-semiconductor transistors, etc. Another type of three-dimensional memory array includes pillars of stacked memory elements, such as vertical NAND strings.

For the reasons stated above, and for other reasons stated below which will become apparent to those skilled in the art upon reading and understanding the present specification, there is a need in the art for alternative stacked (e.g., three-dimensional) memory arrays.

DETAILED DESCRIPTION

Figure 1:
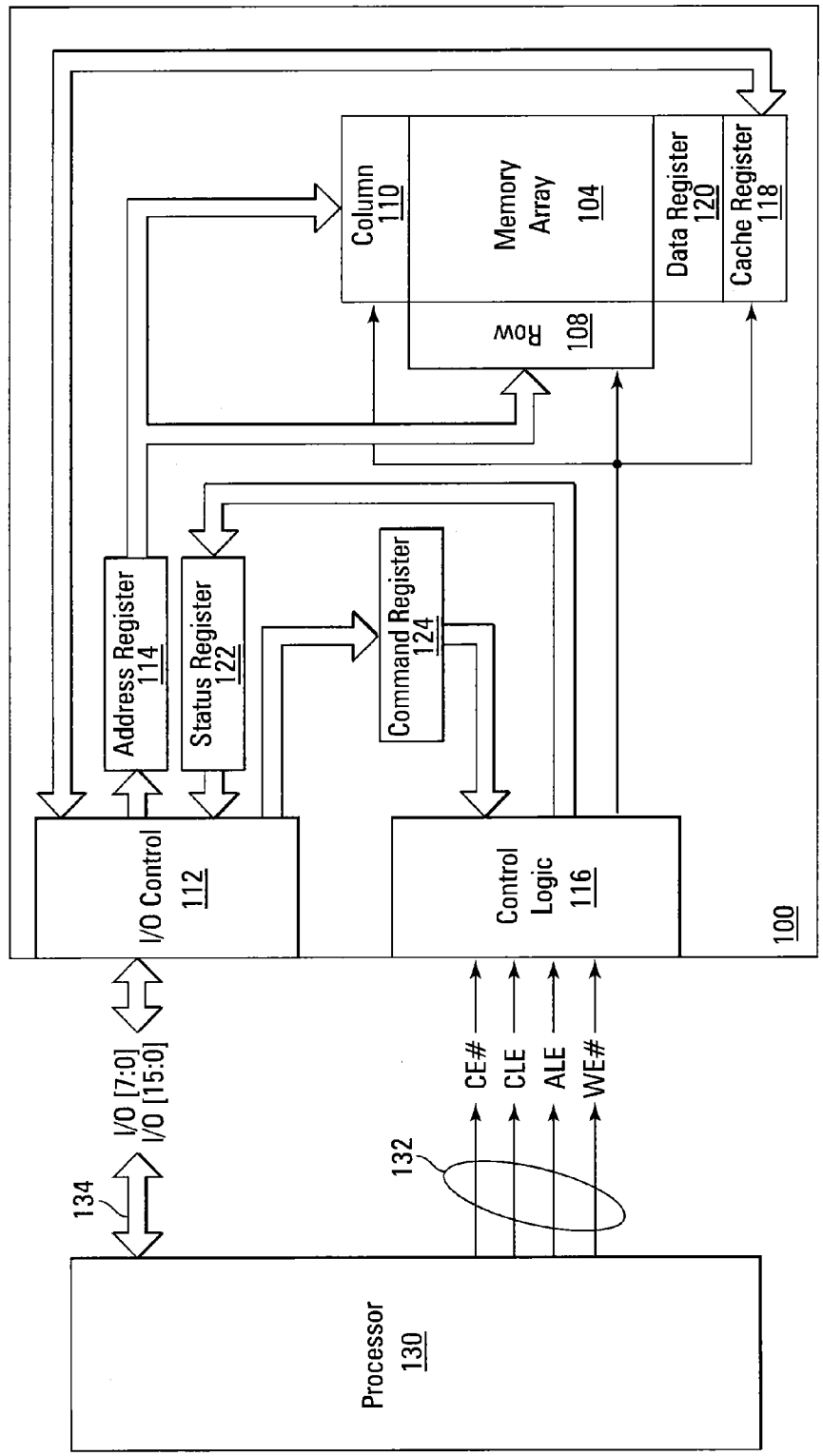
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof. The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The following detailed description is, therefore, not to be taken in a limiting sense.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104, according to embodiments of the disclosure.

For example, memory array 104 may be a stacked (e.g., three-dimensional) memory array formed in accordance with disclosed embodiments and having one or more quasi-two-dimensional (e.g. two "two-dimensional") arrays of memory cells at each of a plurality of different vertical levels and having data lines (e.g., bit lines) located under the arrays of memory cells and coupled thereto. Such stacked memory arrays may be referred to as multi-level (e.g., multi-tier) memory arrays.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
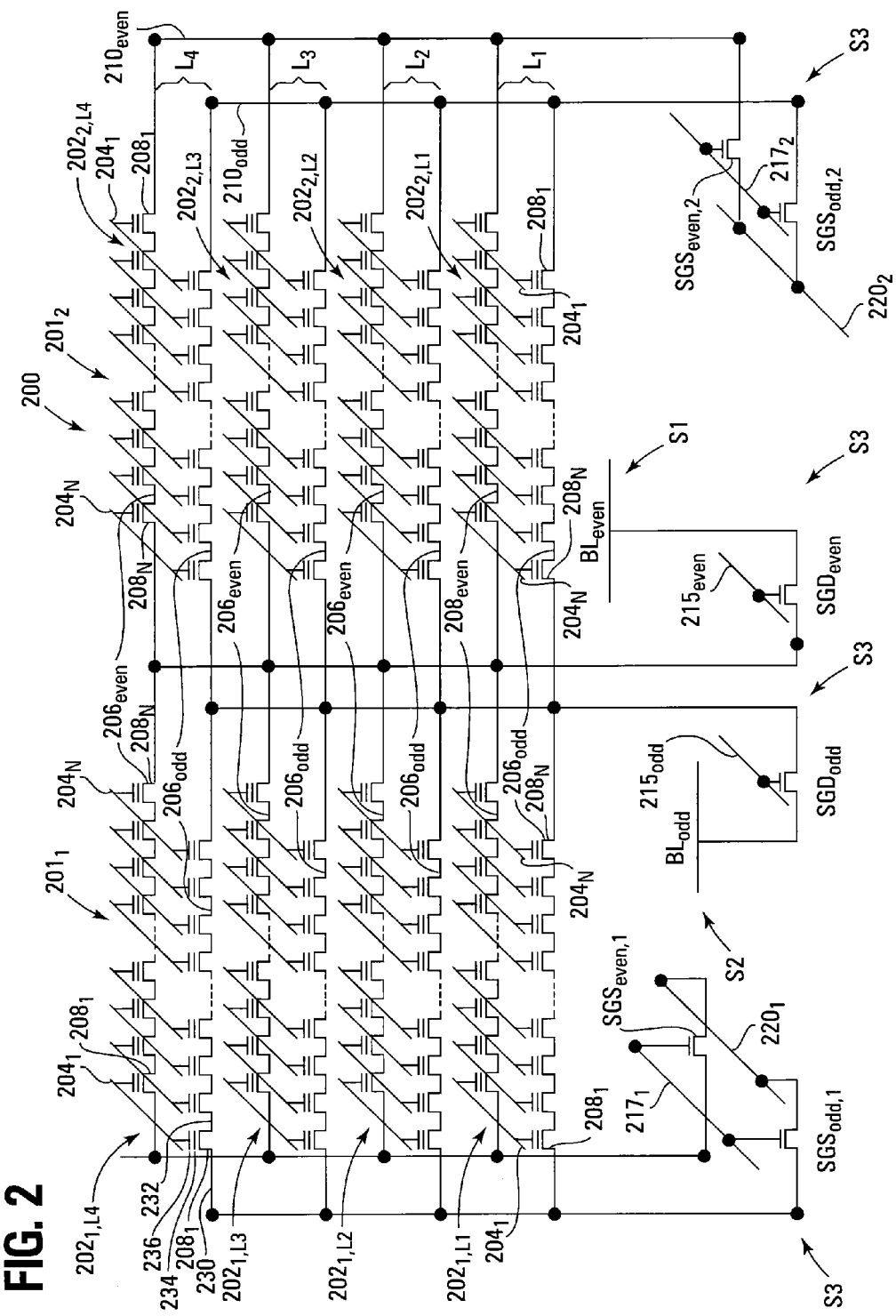
FIG. 2 is a schematic of a stacked NAND memory array, according to another embodiment.

FIG. 2 is a schematic of a stacked memory array 200, e.g., as a portion of memory array 104. The stacked memory array 200 may be, for example, a stacked non-volatile NAND flash memory array or other stacked array of series-coupled memory cells. Herein a stacked memory array may be referred to as a multi-level or a multi-tier memory array or as a three-dimensional memory array. For some embodiments, stacked memory array 200 may include a plurality of stacked non-volatile NAND flash memory arrays 201, such as stacked non-volatile NAND flash memory array $201_1$ and stacked non-volatile NAND flash memory array $201_2$, that are coupled together.

Stacked memory array 200 may include a plurality of levels (e.g., tiers) L, such as vertical levels L1-L4, as shown in FIG. 2. One or more quasi-two-dimensional (e.g., two-dimensional) memory arrays 202 of memory cells 208 may be located at each level L. An array may be considered to be quasi-two dimensional when the memory cells are formed in substantially a single plane, such as a substantially horizontal plane (e.g., substantially perpendicular to the face plane of FIG. 2) located at each of levels L1-L4. For example, memory array $202_{1,L1}$ of array $201_1$ and memory array $202_{2,L1}$ of array $201_2$ may be formed at level L1, memory array $202_{1,L2}$ of array $201_1$ and memory array $202_{2,L2}$ of array $201_2$ at level L2, memory array $202_{1,L3}$ of array $201_1$ and memory array $202_{2,L3}$ of array $201_2$ at level L3, and memory array $202_{1,L4}$ of array $201_1$ memory array and $202_{2,L4}$ of array $201_2$ at level L4. Note that memory arrays $202_{1,L1}$, $202_{1,L2}$, $202_{1,L3}$, and $202_{1,L4}$ may form at least a portion of stacked non-volatile NAND flash memory array $201_1$, and memory arrays $202_{2,L1}$, $202_{2,L2}$, $202_{2,L3}$, and $202_{2,L4}$ may form at least a portion of stacked non-volatile NAND flash memory array $201_2$.

Each memory array 202 may include alternating "odd" and "even" strings of memory cells, such as NAND strings $206_{odd}$ and $206_{even}$. The labels of "odd" and "even" used herein refer to logical groupings of like elements arranged in an alternating fashion, and does not require any particular numerical designation or addressing scheme. Each NAND string 206 includes memory cells 208, such as memory cells $208_1$ to $208_N$ coupled in series source to drain. The NAND strings $206_{odd}$ may be formed in substantially vertical planes (e.g., odd vertical planes $210_{odd}$, one of which is shown in FIG. 2) of stacked memory array 200 that are substantially parallel to the face plane of FIG. 2. The NAND strings $206_{even}$ may be formed in substantially vertical planes (e.g., even vertical planes $210_{even}$, one of which is shown in FIG. 2) of stacked memory array 200 that are substantially parallel (e.g., parallel) to the odd vertical planes and the face plane of FIG. 2. Note that FIG. 2 shows a pair of substantially odd/even vertical planes $210_{odd}/210_{even}$ of stacked memory array 200 and that stacked memory array 200 may include other pairs of odd/even vertical planes $210_{odd}/210_{even}$ substantially parallel (e.g., parallel) to those shown in FIG. 2.

Stacked memory array 200 may further include a level S3 (e.g., a vertical level) that is located under level L1, and thus under the memory arrays 202. Drain select gates, such as odd drain select gates $SGD_{odd}$ and even drain select gates $SGD_{even}$, may be located substantially in a horizontal plane (e.g., substantially perpendicular to the face plane of FIG. 2) at level S3. The single odd drain select gate $SGD_{odd}$ shown in FIG. 2 may be formed at level S3 and corresponds to the odd NAND strings $206_{odd}$ located substantially in odd vertical plane $210_{odd}$, and the single even drain select gate $SGD_{even}$ shown in FIG. 2 may be formed at level S3 and corresponds to the even NAND strings $206_{even}$ located substantially in even vertical plane $210_{even}$.

The single odd drain select gate $SGD_{odd}$ is coupled to the odd NAND strings $206_{odd}$, e.g., all of the odd NAND strings $206_{odd}$ of the stacked non-volatile NAND flash memory arrays $201_1$ and $201_2$, in odd vertical plane $210_{odd}$, and the single even drain select gate $SGD_{even}$ is coupled to the even NAND strings $206_{even}$, e.g., all of the even NAND strings $206_{even}$ of the stacked non-volatile NAND flash memory arrays $201_1$ and $201_2$, in even vertical plane $210_{even}$. This means, for the example depicted in FIG. 2, that the odd NAND strings $206_{odd}$ of both arrays $201_1$ and $201_2$ at each vertical level in odd vertical plane $210_{odd}$ are coupled to the same odd drain select gate $SGD_{odd}$ and that the even NAND strings $206_{even}$ of both arrays $201_1$ and $201_2$ at each vertical level in even vertical plane $210_{even}$ are coupled to the same even drain select gate $SGD_{even}$. Note that the drain of the last memory cell $208_N$ of each odd NAND string $206_{odd}$ coupled to an odd drain select gate $SGD_{odd}$ is coupled to the source of that odd drain select gate $SGD_{odd}$ and that the drain of the last memory cell $208_N$ of each even NAND string $206_{even}$ coupled to an even drain select gate $SGD_{even}$ is coupled to the source of that even drain select gate $SGD_{even}$.

For some embodiments, drain select gates $SGD_{odd}$ and $SGD_{even}$ form an odd/even pair of drain select gates $SGD_{odd}/SGD_{even}$, corresponding to the pair of odd/even vertical planes $210_{odd}/210_{even}$. Note that other odd/even pairs of drain select gates $SGD_{odd}/SGD_{even}$ may respectively correspond to other pairs of odd/even vertical planes $210_{odd}/210_{even}$ of stacked memory array 200 in a manner similar to (e.g., the same as) that shown in FIG. 2 and may be located at vertical layer S3.

The odd drain select gates $SGD_{odd}$ of the respective pairs of odd/even pairs $SGD_{odd}/SGD_{even}$ respectively correspond to odd vertical planes $210_{odd}$ of the respective pairs of odd/even vertical planes $210_{odd}/210_{even}$ on a one-to-one basis, and each odd drain select gate $SGD_{odd}$ may be coupled to the odd NAND strings $206_{odd}$, e.g., all of the odd NAND strings $206_{odd}$ of the stacked non-volatile NAND flash memory arrays $201_1$ and $201_2$, of a corresponding odd vertical plane $210_{odd}$ in a manner similar to (e.g., the same as) that shown on FIG. 2 and described above in conjunction with FIG. 2. The even drain select gates $SGD_{even}$ of the respective pairs of odd/even pairs $SGD_{odd}/SGD_{even}$ respectively correspond to even vertical planes $210_{even}$ of the respective pairs of odd/even vertical planes $210_{odd}/210_{even}$ on a one-to-one basis, and each even drain select gate $SGD_{even}$ may be coupled to the even NAND strings $206_{even}$, all the even NAND strings $206_{even}$ of the stacked non-volatile NAND flash memory arrays $201_1$ and $201_2$, of a corresponding even vertical plane $210_{even}$ in a manner similar to (e.g., the same as) that shown on FIG. 2 and described above in conjunction with FIG. 2.

The odd drain select gates $SGD_{odd}$ respectively corresponding to the odd vertical planes $210_{odd}$ of stacked memory array 200 may be commonly coupled to the same odd drain select line $215_{odd}$, and the drain select gates $SGD_{even}$ respectively corresponding to the even vertical planes $210_{even}$ of stacked memory array 200 may be commonly coupled to the same even drain select line $215_{even}$. The odd drain select gates $SGD_{odd}$ respectively corresponding to the odd vertical planes $210_{odd}$ of stacked memory array 200 may be respectively coupled, one-to-one, to different odd data lines, such as odd bit lines $BL_{odd}$, and the even drain select gates $SGD_{odd}$ respectively corresponding to the even vertical planes $210_{even}$ of stacked memory array 200 may be respectively coupled, one-to-one, to different even data lines, such as even bit lines $BL_{even}$.

For example, the drain of the odd drain select gate $SGD_{odd}$ corresponding to the odd vertical plane $210_{odd}$ in FIG. 2 may be coupled to the odd bit line $BL_{odd}$ shown in FIG. 2, and the drain of the even drain select gate $SGD_{even}$ corresponding to the even vertical plane $210_{even}$ in FIG. 2 may be coupled to the even bit line $BL_{even}$ shown in FIG. 2. Note that a single odd drain select gate $SGD_{odd}$ may selectively couple a single odd bit line $BL_{odd}$ to the odd NAND strings $206_{odd}$, e.g., all of the odd NAND strings $206_{odd}$, in a corresponding odd vertical plane $210_{odd}$ concurrently, and a single even drain select gate $SGD_{even}$ may selectively couple a single even bit line $BL_{even}$ to the even NAND strings $206_{even}$, e.g., all of the even NAND strings $206_{even}$, in a corresponding even vertical plane $210_{even}$ concurrently.

For some embodiments, each odd bit line $BL_{odd}$ is formed at a vertical level S2 located between the vertical levels S3 and L1 of stacked memory array 200, and each even bit line $BL_{even}$ is formed at a vertical level S1 located between the vertical levels S2 and L1. That is, each odd bit line $BL_{odd}$ is located under the memory arrays 202, but above the odd and even drain select gates $SGD_{odd}$ and $SGD_{even}$, and each even bit line $BL_{even}$ is located under the memory arrays 202, but above each odd bit line $BL_{odd}$.

For some embodiments, all the odd NAND strings $206_{odd}$ of each vertical plane $210_{odd}$ of array $201_1$ are coupled to a single odd source select gate $SGS_{odd,1}$; all the odd NAND strings $206_{odd}$ of each vertical plane $210_{odd}$ of array $201_2$ are coupled to a single odd source select gate $SGS_{odd,2}$; all the even NAND strings $206_{even}$ of each vertical plane $210_{even}$ of array $201_1$ are coupled to a single even source select gate $SGS_{even,1}$; and all the even NAND strings $206_{even}$ of each vertical plane $210_{even}$ of array $201_2$ are coupled to a single even source select gate $SGS_{even,2}$, as shown in FIG. 2.

For some embodiments, source select gates $SGS_{odd,1}$ and $SGS_{even,1}$ form an odd/even pair of source select gates $SGS_{odd,1}/SGS_{even,1}$ corresponding to the pair of odd/even vertical planes $210_{odd}/210_{even}$ of the array $201_1$, and source select gates $SGS_{odd,2}$ and $SGS_{even,2}$ form and an odd/even pair of source select gates $SGS_{odd,2}/SGS_{even,2}$ corresponding to the pair of odd/even vertical planes $210_{odd}/210_{even}$ of the array $201_2$. Note that other odd/even pairs of source select gates $SGS_{odd,1}/SGS_{even,1}$ (not shown in FIG. 2) may respectively correspond, one-to-one, to other pairs of odd/even vertical planes $210_{odd}/210_{even}$ of array $201_1$ in a manner similar to (e.g., the same as) that shown in FIG. 2 and that other odd/even pairs of source select gates $SGS_{odd,2}/SGS_{even,2}$ (not shown in FIG. 2) may respectively correspond, one-to-one, to other pairs of odd/even vertical planes $210_{odd}/210_{even}$ of array $201_2$ in a manner similar to (e.g., the same as) that shown in FIG. 2.

The odd source select gates $SGS_{odd,1}$ of the respective pairs of odd/even pairs $SGS_{odd,1}/SGS_{even,1}$ respectively correspond to odd vertical planes $210_{odd}$ of the respective pairs of odd/even vertical planes $210_{odd}/210_{even}$ of array $201_1$ on a one-to-one basis, and the respective source select gates $SGS_{odd,1}$ may be coupled to the odd NAND strings $206_{odd}$, e.g., all of the odd NAND strings $206_{odd}$, of a corresponding odd vertical plane $210_{odd}$ of array $201_1$ in a manner similar to (e.g., the same as) that shown on FIG. 2 and described above in conjunction with FIG. 2. The even source select gates $SGS_{even,1}$ of the respective pairs of odd/even pairs $SGS_{odd,1}/SGS_{even,1}$ respectively correspond to even vertical planes $210_{even}$, of the respective pairs of odd/even vertical planes $210_{odd}/210_{even}$ of array $201_1$ on a one-to-one basis, and the respective even source select gates $SGS_{even,1}$ may be coupled to the even NAND strings $206_{even}$, e.g., all of the even NAND strings $206_{even}$, of a corresponding even vertical plane $210_{even}$ of array $201_1$ in a manner similar to (e.g., the same as) that shown on FIG. 2 and described above in conjunction with FIG. 2.

The odd source select gates $SGS_{odd,2}$ of the respective pairs of odd/even pairs $SGS_{odd,2}/SGS_{even,2}$ respectively correspond to odd vertical planes $210_{odd}$ of the respective pairs of odd/even vertical planes $210_{odd}/210_{even}$ of array $201_2$ on a one-to-one basis, and the respective source select gates $SGS_{odd,2}$ may be coupled to the odd NAND strings $206_{odd}$, e.g., all of the odd NAND strings $206_{odd}$, of a corresponding odd vertical plane $210_{odd}$ of array $201_2$ in a manner similar to (e.g., the same as) that shown on FIG. 2 and described above in conjunction with FIG. 2. The even source select gates $SGS_{even,2}$ of the respective pairs of odd/even pairs $SGS_{odd,2}/SGS_{even,2}$ respectively correspond to even vertical planes $210_{even}$ of the respective pairs of odd/even vertical planes $210_{odd}/210_{even}$ of array $201_2$ on a one-to-one basis, and the respective even source select gates $SGS_{even,2}$ may be coupled to the even NAND strings $206_{even}$, e.g., all of the even NAND strings $206_{even}$, of a corresponding even vertical plane $210_{odd}$ of array $201_2$ in a manner similar to (e.g., the same as) that shown on FIG. 2 and described above in conjunction with FIG. 2.

The source of the first memory cell $208_1$ of each odd NAND string $206_{odd}$ of array $201_1$ coupled to an odd source select gate $SGS_{odd,1}$ may be coupled to the drain of that odd source select gate $SGS_{odd,1}$; the source of the first memory cell $208_1$ of each odd NAND string $206_{odd}$ of array $201_2$ coupled to an odd source select gate $SGS_{odd,2}$ may be coupled to the drain of that odd source select gate $SGS_{odd,2}$; the source of the first memory cell $208_1$ of each even NAND string $206_{even}$ of array $201_1$ coupled to an even source select gate $SGS_{even,1}$ may be coupled to the drain of that even source select gate $SGS_{even,1}$; and the source of the first memory cell $208_1$ of each even NAND string $206_{even}$ of array $201_2$ coupled to an even source select gate $SGS_{even,2}$ may be coupled to the drain of that even source select gate $SGS_{even,2}$.

The odd source select gates $SGS_{odd,1}$ respectively corresponding to the odd vertical planes $210_{odd}$ of array $201_1$ and the even source select gates $SGS_{even,1}$ respectively corresponding to the even vertical planes $210_{even}$ of array $201_1$ may be commonly coupled to the same source select line $217_1$. The odd source select gates $SGS_{odd,2}$ respectively corresponding to the vertical odd planes $210_{odd}$ of array $201_2$ and the even source select gates $SGS_{even,1}$ respectively corresponding to the even vertical planes $210_{even}$ of array $201_2$ may be commonly coupled to the same source select line $217_2$.

The odd source select gates $SGS_{odd,1}$ respectively corresponding to the odd vertical planes $210_{odd}$ of array $201_1$ and the even source select gates $SGS_{even,1}$ respectively corresponding to the even vertical planes $210_{even}$ of array $201_1$ may be commonly coupled to the same source line $220_1$. For example, the odd/even source select gate pairs $SGS_{odd,1}/SGS_{even,1}$ respectively corresponding to the pairs of odd/even vertical planes $210_{odd}/210_{even}$ of array $201_1$ are coupled to the same source line $220_1$. The odd source select gates $SGS_{odd,2}$ respectively corresponding to the odd vertical planes $210_{odd}$ of array $201_2$ and the even source select gates $SGS_{even,1}$ respectively corresponding to the even vertical planes $210_{even}$ of array $201_2$ may be commonly coupled to the same source line $220_2$. For example, the odd/even source select gate pairs $SGS_{odd,2}/SGS_{even,2}$ respectively corresponding to the pairs of odd/even vertical planes $210_{odd}/210_{even}$ of array $201_2$ are coupled to the same source line $220_2$. For some embodiments, source lines $220_1$ and $220_2$ may be electrically coupled to form a common source line of stacked memory array 200.

Note that, in the example of FIG. 2, a single odd source select gate $SGS_{odd,1}$ selectively couples source line $220_1$ to all of the odd NAND strings $206_{odd}$ in a corresponding odd vertical plane $210_{odd}$ of array $201_1$ concurrently; a single odd source select gate $SGS_{odd,2}$ selectively couples source line $220_2$ to all of the odd NAND strings $206_{odd}$ in a corresponding odd vertical plane $210_{odd}$ of array $201_2$ concurrently; a single even source select gate $SGS_{even,1}$ selectively couples source line $220_1$ to all of the even NAND strings $206_{even}$ in a corresponding even vertical plane $210_{even}$ of array $201_1$ concurrently; and a single even source select gate $SGS_{even,2}$ selectively couples source line $220_2$ to all of the even NAND strings $206_{even}$ in a corresponding even vertical plane $210_{even}$ of array $201_2$ concurrently.

For some embodiments, the source select gates SGS may be located substantially in the same horizontal plane as drain select gates $SGD_{odd}$ and $SGD_{even}$. That is, the source select gates SGS may be formed at level S3 of stacked memory array 200.

An example construction of memory cells 208 may include a source 230 and a drain 232, a charge storage structure 234 (e.g., a floating gate, charge trap, etc.) that can store a charge that determines a data value of the cell, and a control gate 236, as shown in FIG. 2. Memory cells 208 have their control gates 236 coupled to (and in some cases form) an access line, such as a word line 204. For example, the memory cells $208_1$ to $208_N$ of each NAND string 206 are respectively coupled one-to-one to word lines $204_1$ to $204_N$. A column of the memory cells 208 in each quasi-two-dimensional array 202 may be a NAND string 206 coupled to a bit line, such as an odd bit line $BL_{odd}$ or an even bit line $BL_{even}$. A row of the memory cells 208 in each quasi-two-dimensional array 202 may be those memory cells commonly coupled to a given word line 204.

The memory cells 208 may represent non-volatile memory cells for storage of data. For some embodiments, each of the memory cells 208 may be a single-level cell programmable to store a single bit (e.g., digit) of information or a multi-level cell programmable to store more than one bit of information.

Note that, for some embodiments, the source and drain select gates may have the same structure as memory cells 208, e.g., having a charge storage structure and a control gate, and thus may be programmable. Alternatively, the source and drain select gates may be non-programmable field effect transistors (FETs).

Figure 3A:
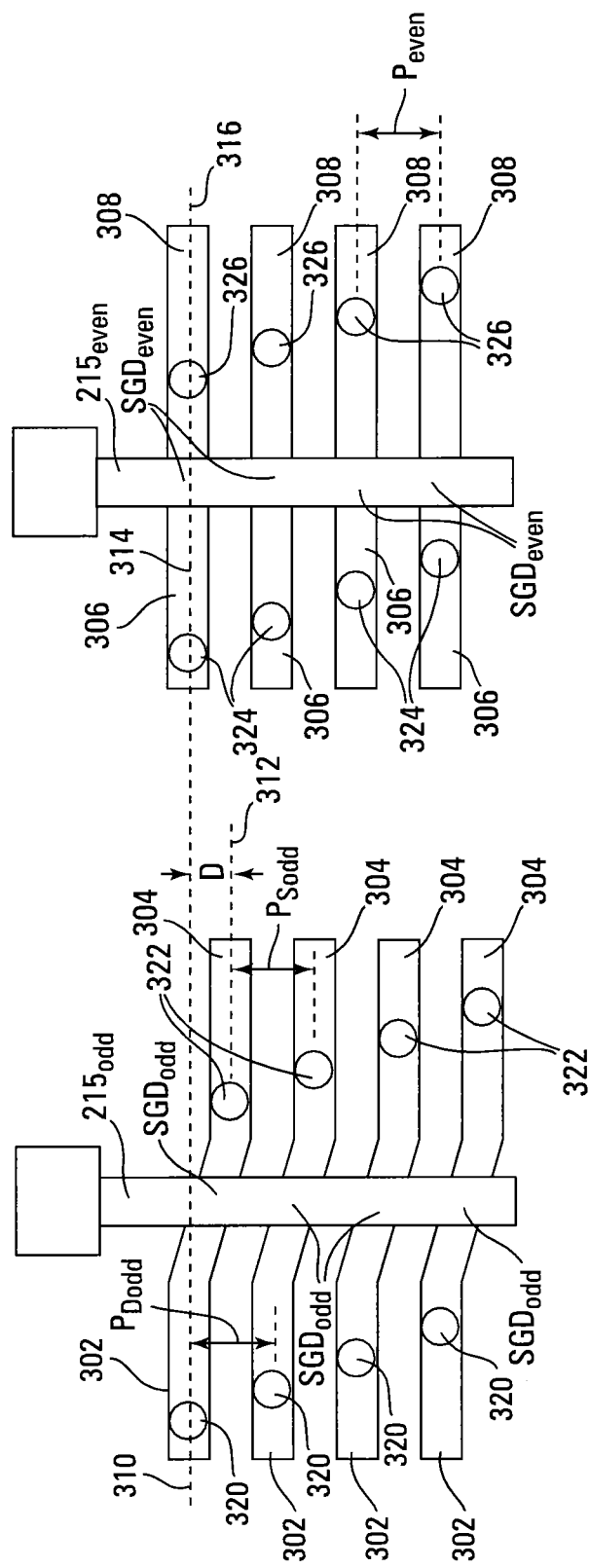
FIGS. 3A-3C are plan views of a portion of a memory array during various stages of fabrication, according to another embodiment.
Figure 3B:
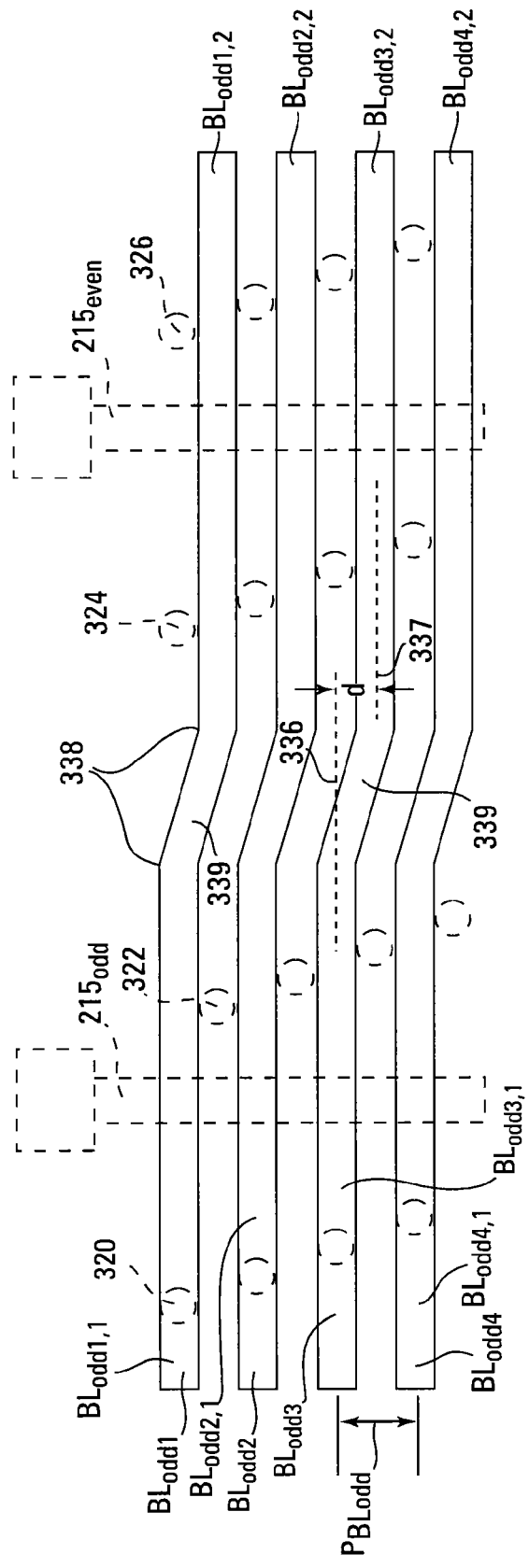
Figure 3C:
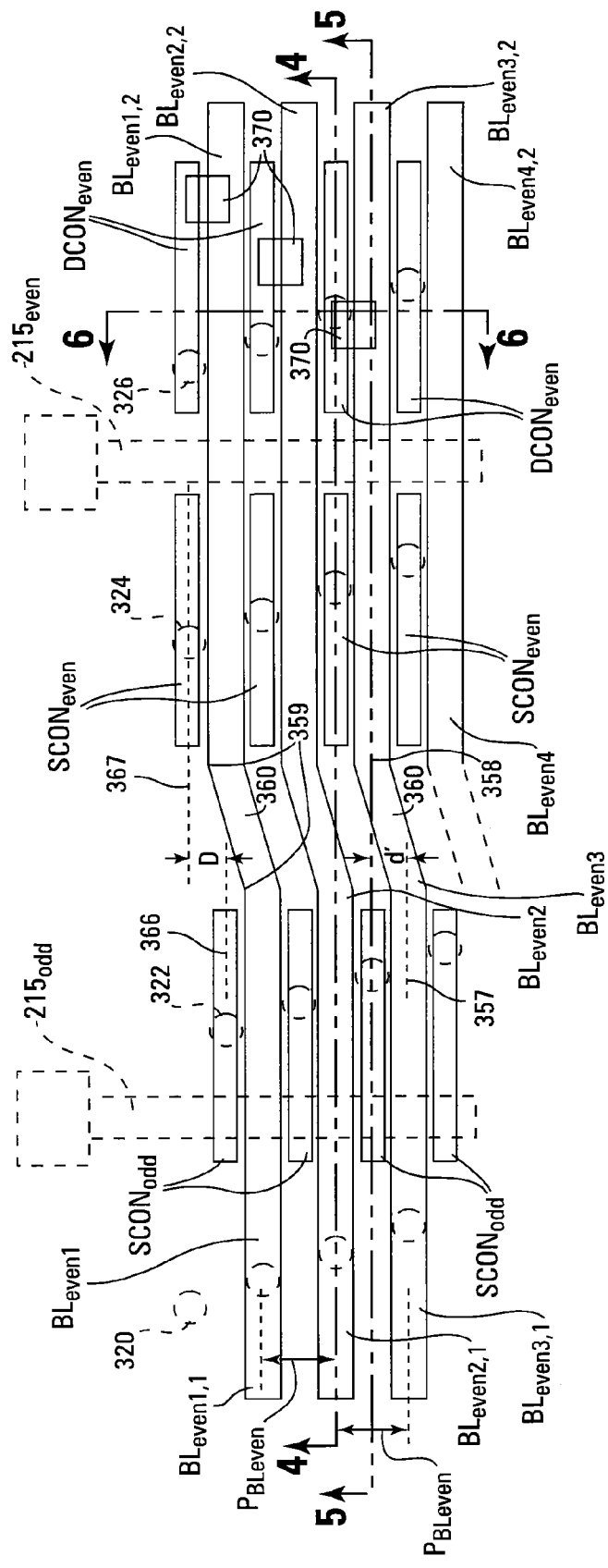

FIGS. 3A-3C are plan views of a portion of a memory array, such as a portion of the stacked memory array 200 of FIG. 2, during various stages of fabrication. For example, FIGS. 3A-3C respectively correspond to different levels (e.g., vertical levels) within stacked memory array 200, e.g., FIGS. 3A-3C respectively substantially correspond to levels S3, S2, and S1 of stacked memory array 200.

Figure 4:
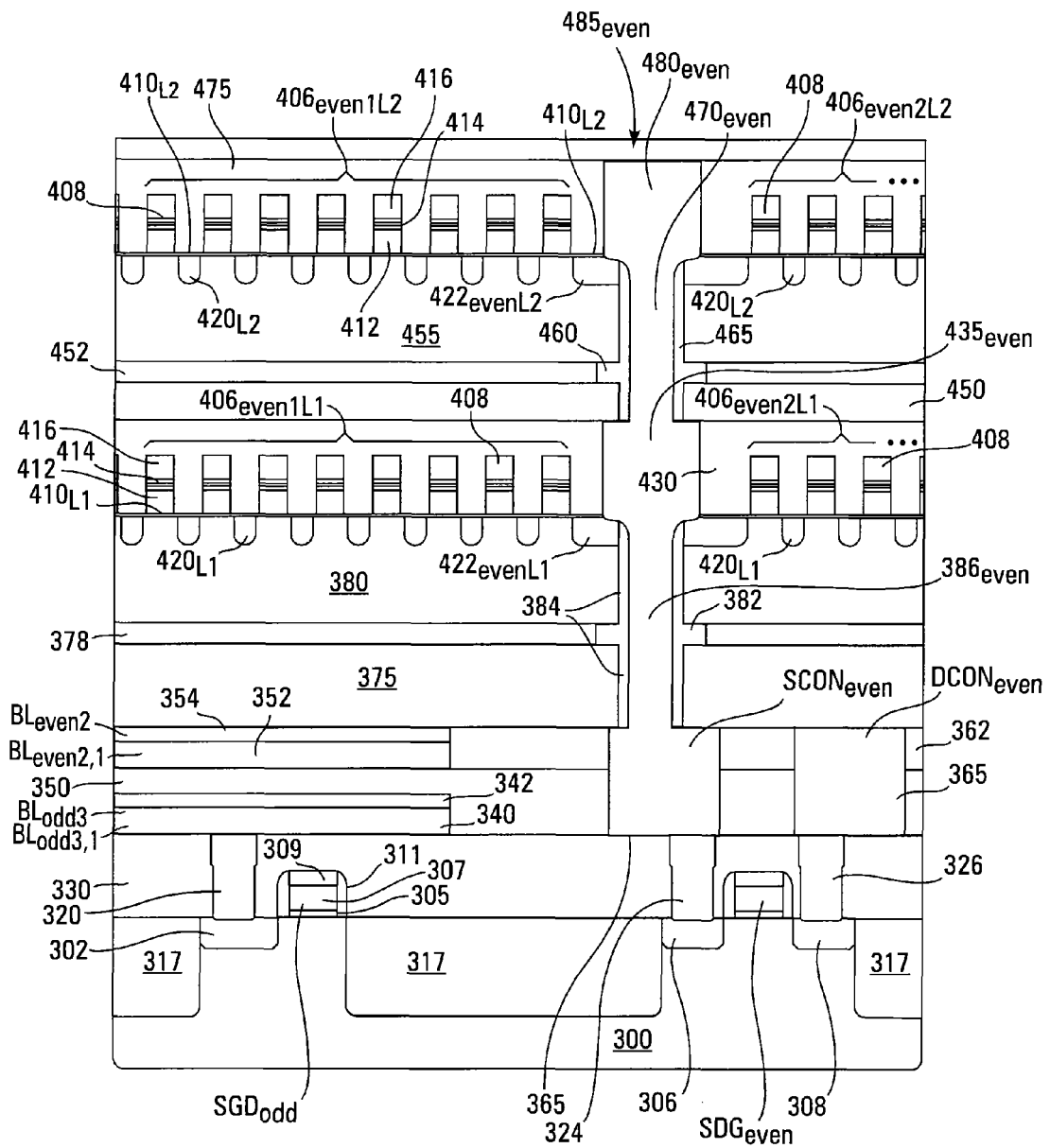
FIG. 4 is a cross-sectional view taken along line 4-4 of FIG. 3C, according to another embodiment.
Figure 5:
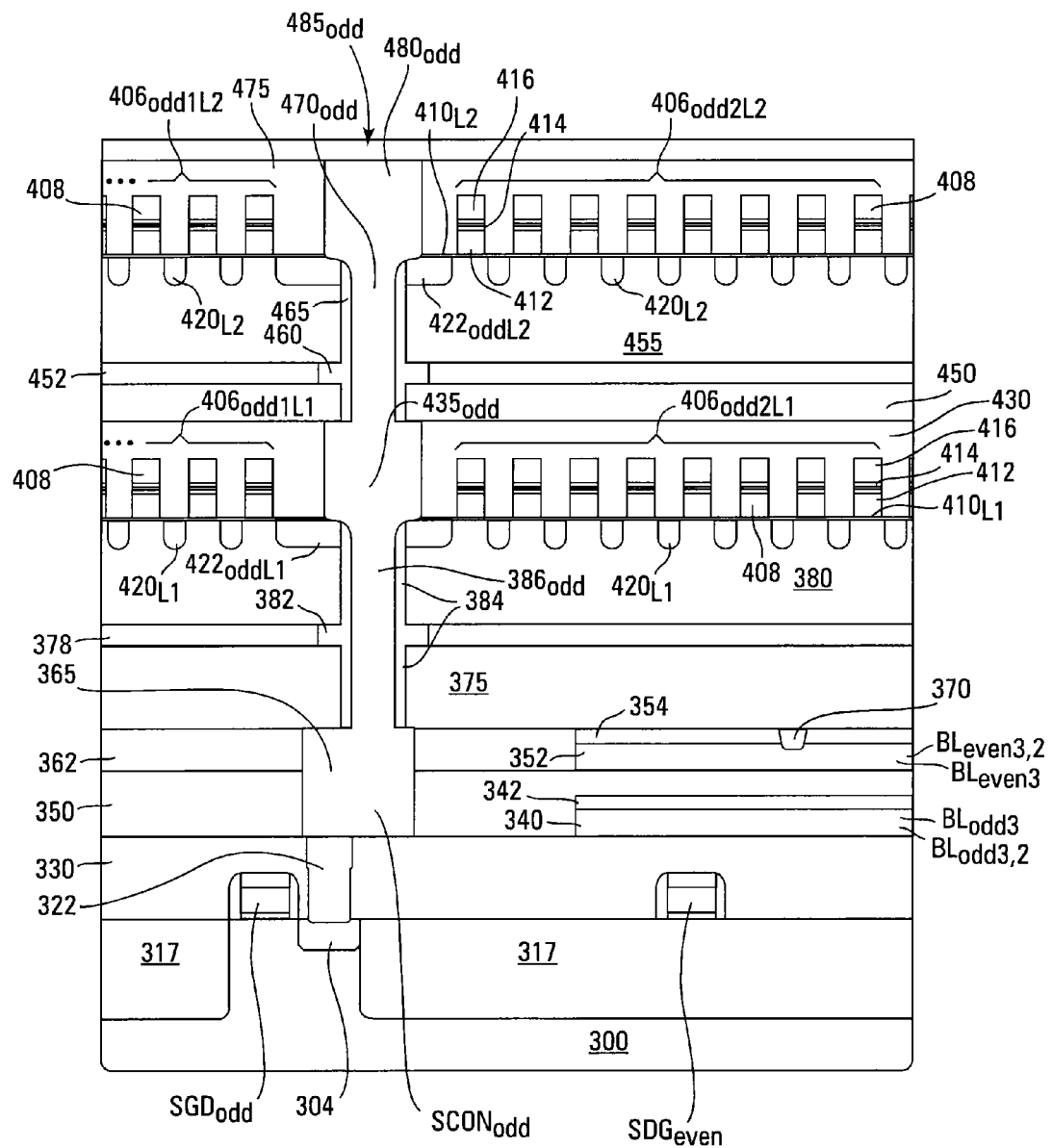
FIG. 5 is a cross-sectional view taken along line 5-5 of FIG. 3C, according to another embodiment.
Figure 6:
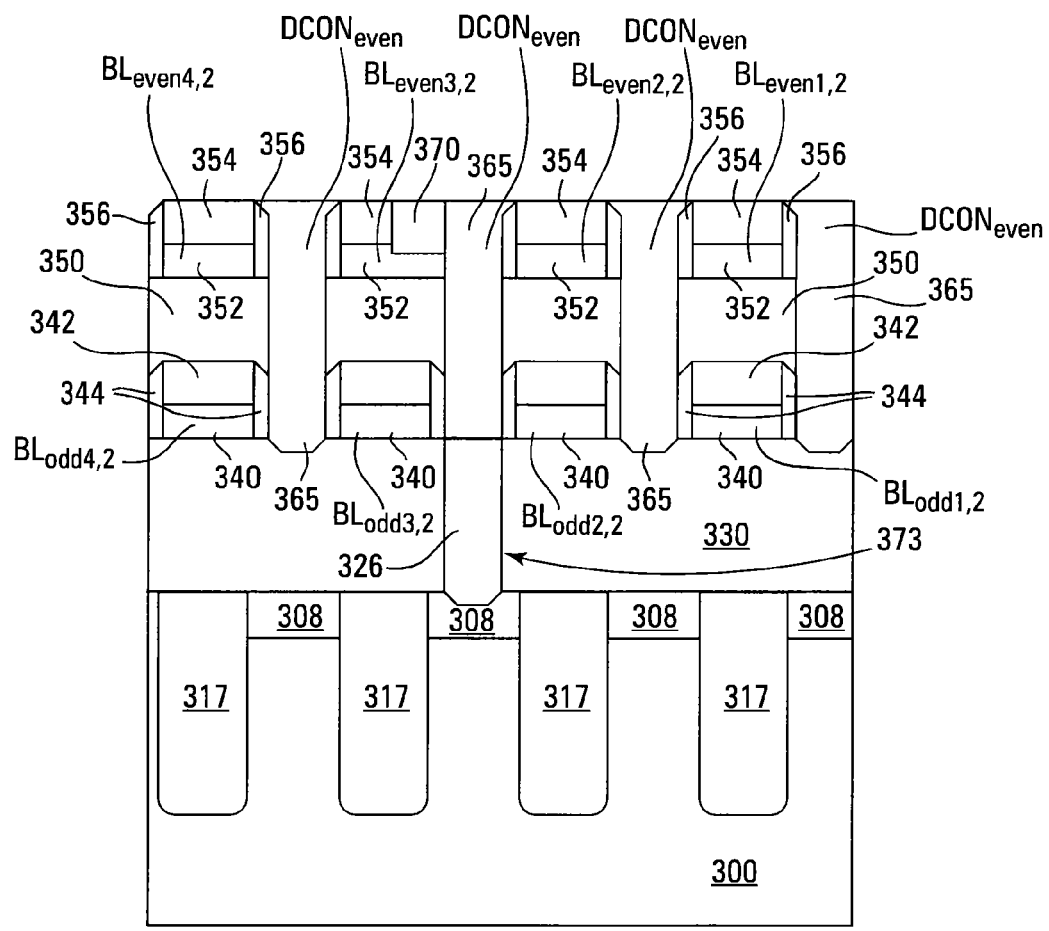
FIG. 6 is a cross-sectional view taken along line 6-6 of FIG. 3C, according to another embodiment.

FIGS. 4, 5, and 6 are cross-sectional views (cross-hatching omitted) respectively taken along lines 4-4, 5-5, and 6-6 of FIG. 3C. Note, however, that the cross-sections in FIGS. 4 and 5 extend to a level (e.g., vertical level) beyond the level shown in FIG. 3C to include the first two levels of memory cells, e.g., vertical levels L1 and L2 of stacked memory array 200 of FIG. 2. In particular, FIGS. 4-6 illustrate odd and even drain select gates, such as odd drain select gate $SGD_{odd}$ and even drain select gate $SGD_{even}$ of stacked memory array 200, the coupling of the odd and even drain select gates to NAND strings of memory cells, e.g., at vertical levels L1 and L2, and the coupling of the odd and even bit lines, such as odd bit lines $BL_{odd}$ and even bit lines $BL_{even}$ respectively to the odd and even drain select gates.

In FIG. 3A, source/drain regions 302, 304, 306, and 308, are formed in a semiconductor, such as semiconductor 300, as shown in FIGS. 4-6. In some embodiments, semiconductor 300 may be comprised of silicon that may be conductively doped, e.g., to have a p-type or n-type conductivity. An upper surface of semiconductor 300 may be at substantially the level S3 of FIG. 2.

Source/drain regions 302, 304, 306, and 308 may, for example, have n-type conductivity when semiconductor 300 has p-type conductivity or p-type conductivity when semiconductor 300 has n-type conductivity. For some embodiments, source/drain regions 302 and 308 may act as drain regions 302 and 308, and source/drain regions 304 and 306 may act as source regions 304 and 308. Hereinafter, source/drain regions 302 and 308 will be referred to as drain regions 302 and 308, and source/drain regions 304 and 306 will be referred to as source regions 304 and 306 with regard to the example embodiment of various figures.

Drain select gates, such as odd drain select gates $SGD_{odd}$, are formed over semiconductor 300 between and electrically coupled to drain regions 302 and source regions 304, e.g., drain regions 302 and source regions 304 may be referred to as odd drain and source regions. For example, each odd drain select gate $SGD_{odd}$ may be coupled to an odd drain region 302 and a corresponding odd source region 304. The odd drain select gates $SGD_{odd}$ form portions of the odd drain select line $215_{odd}$.

The odd drain region 302 and the corresponding odd source region 304 coupled to an odd drain select gate $SGD_{odd}$ may be staggered (e.g., offset) from each other, e.g., the odd drain region 302 and the corresponding odd source region 304 are misaligned. For example, a centerline 310 of the odd drain region 302 may be offset by a particular distance (e.g., an offset distance) D from a centerline 312 of the corresponding odd source region 304, as shown in FIG. 3A, and such that centerlines 310 and 312 are not collinear.

Drain select gates, such as even drain select gates $SGD_{even}$, are formed over semiconductor 300 between and electrically coupled to source regions 306 and drain regions 308, e.g., source regions 306 and drain regions 308 may be referred to as even source and drain regions. For example, each even drain select gate $SGD_{even}$ is coupled to an even source region 306 and a corresponding even drain region 308. The even source region 306 and the corresponding even drain region 308 coupled to an even drain select gate $SGD_{even}$ may be aligned with each other. For example, a centerline 314 of the even source region 306 may be substantially collinear (e.g., collinear) with a centerline 316 the corresponding even drain region 308, as shown in FIG. 3A. The even drain select gates $SGD_{even}$ may form portions of the even drain select line $215_{even}$.

For some embodiments, the drain select gates $SGD_{odd}$ and $SGD_{even}$ may be formed substantially concurrently (e.g., concurrently) and may include a gate dielectric 305, e.g., a gate oxide, formed over semiconductor 300 and a control gate 307 formed over the gate dielectric 305, as shown in FIG. 4 for an odd drain select gate $SGD_{odd}$. A protective dielectric cap 309, e.g., a nitride cap, may be formed over control gate 307. Protective dielectric spacers 311, e.g. nitride spacers, may be formed over sidewalls of the drain select gates. Control gate 307 may generally be formed of one or more conductive materials and may comprise, consist of, or consist essentially of conductively doped polysilicon and/or may comprise, consist of, or consist essentially of metal, such as a refractory metal, or a metal-containing material, such as a refractory metal silicide layer, as well as other conductive materials. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. Note that the source select gates select gate $SGS_{odd,1}$, $SGS_{odd,2}$, $SGS_{even,1}$, and $SGS_{even,2}$ of FIG. 2 may have substantially the same (e.g., the same) structure as the drain select gates and may be formed substantially concurrently (e.g., concurrently) with the drain select gates $SGD_{odd}$ and $SGD_{even}$.

For some embodiments, odd drain regions 302 may be respectively aligned with even source regions 306 and even drain regions 308. For example, centerlines 310 of odd drain regions 302 may be respectively substantially collinear (e.g., collinear) with centerlines 314 of even source regions 306 and centerlines 316 of even drain regions 308, as shown in FIG. 3A. This means that the centerlines 312 of odd source regions 304 and the centerlines 314 of even source regions 306 are offset by the distance D, as are the centerlines 312 of odd source regions 304 and the centerlines 316 of even drain regions 308.

Isolation regions 317, e.g., shallow trench isolation (STI) regions, may be formed in semiconductor 300, as shown in FIGS. 4-6. For example, an isolation region 317 may be located between successively adjacent even drain regions 308, as shown in FIG. 6. Similarly, isolation regions 317 may be located between successively adjacent odd drain regions 302, between successively adjacent odd source regions 304, and between successively adjacent even source regions 306 (not shown). A portion of an isolation region 317 may extend between drain select gates $SGD_{odd}$ and $SGD_{even}$, as shown in FIG. 4. Note that portions of drain select gates $SGD_{odd}$ and $SGD_{even}$ may extend over isolation regions 317, as shown for even drain select gate $SGD_{even}$ in FIG. 5.

Isolation regions 317 may be formed by depositing a suitable dielectric material, such as an oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc., within openings (e.g., trenches) formed in semiconductor 300.

Contacts 320 may be coupled to (e.g., formed in direct physical contact with) odd drain regions 302 on a one to one basis, as shown in FIGS. 3A and 4. Contacts 322 may be coupled to (e.g., formed in direct physical contact with) odd source regions 304 on a one to one basis, as shown in FIGS. 3A and 5. Contacts 324 may be coupled to (e.g., formed in direct physical contact with) even source regions 306 on a one to one basis, as shown in FIGS. 3A and 4. Contacts 326 may be coupled to (e.g., formed in direct physical contact with) even drain regions 308 on a one to one basis, as shown in FIGS. 3A and 4.

Contacts 320 may be respectively substantially vertically aligned (e.g., vertically aligned) on a one to one basis with odd drain regions 302, e.g., where a vertically aligned contact 320 and odd drain region 302 are intersected by (e.g., lie in) the same single vertical plane, such as the vertical plane of FIG. 4. Contacts 322 may be respectively vertically aligned on a one to one basis with odd source regions 304, e.g., where a vertically aligned contact 322 and odd source region 304 are intersected by the same single vertical plane, such as the vertical plane of FIG. 5. Contacts 324 may be respectively vertically aligned on a one to one basis with even source regions 306, e.g., where a vertically aligned contact 324 and even source region 306 are intersected by the same single vertical plane, such as the vertical plane of FIG. 4. Contacts 326 may be respectively vertically aligned on a one to one basis with even drain regions 308, e.g., where a vertically aligned contact 326 and even drain region 308 are intersected by the same single vertical plane, such as the vertical plane of FIG. 4. Note that as used herein vertical alignment of two or more elements means that the two or more elements are intersected by (e.g., lie in) the same single vertical plane.

The respective contacts 320 may be staggered (e.g., offset) from each other, e.g., the respective contacts 320 may be misaligned. For example, the respective contacts 320 may be respectively at different distances from their respective odd drain select gates $SGD_{odd}$. The respective contacts 322 may be staggered (e.g., offset) from each other, e.g., the respective contacts 322 may be misaligned. For example, the respective contacts 322 may be respectively at different distances from their respective odd drain select gates $SGD_{odd}$. The respective contacts 324 may be staggered (e.g., offset) from each other, e.g., the respective contacts 324 may be misaligned. For example, the respective contacts 324 may be respectively at different distances from their respective even drain select gates $SGD_{even}$. The respective contacts 326 may be staggered (e.g., offset) from each other, e.g., the respective contacts 326 may be misaligned. For example, the respective contacts 326 may be respectively at different distances from their respective even drain select gates $SGD_{even}$.

Contacts 322 may be offset from (e.g., misaligned with) contacts 320 and contacts 324 and 326 by the distance D, e.g., contacts 322 and 320, contacts 322 and 324, and contacts 322 and 326 are staggered. The pitch of contacts 320 and odd drain regions 302 is $P_{Dodd}$; the pitch of contacts 322 and odd source regions 304 is $P_{Sodd}$; the pitch of contacts 324 and even source regions 306 and of contacts 326 and even drain regions 308 is $P_{even}$, where $P_{Dodd}$, $P_{Sodd}$, and $P_{even}$ may be substantially equal (e.g., equal). For some embodiments, the distance D may be about one half of the pitches $P_{Dodd}$, $P_{Sodd}$, and $P_{even}$.

Contacts 320, 322, 324, and 326 may pass through a dielectric 330 that is formed over semiconductor 300, and may stop on, within or below their respective source or drain regions, as shown in FIGS. 4-6. For example, contacts 320, 322, 324, and 326 may formed in openings that pass through dielectric 330.

Contacts 320, 322, 324, and 326 are generally formed of one or more conductive materials and may comprise, consist of, or consist essentially of conductively doped polysilicon and/or may comprise, consist of, or consist essentially of metal, such as a refractory metal, or a metal-containing material, such as a refractory metal silicide layer, as well as other conductive materials. Dielectric 330 is generally formed of one or more dielectric materials, and may be oxide, TEOS (tetraethylorthosilicate), nitride, doped silicate glass, etc. Examples of doped silicate glasses include BSG (borosilicate glass), PSG (phosphosilicate glass), and BPSG (borophosphosilicate glass).

Data lines, such as odd bit lines $BL_{odd}$ (e.g., odd bit lines $BL_{odd1}$ to $BL_{odd4}$), may be formed over an upper surface of dielectric 330, as shown in FIGS. 3B and 4-6, and thus over odd drain regions 302, odd source regions 304, even source regions 306, and even drain regions 326, over odd drain select gates $SGD_{odd}$ and even drain select gates $SGD_{even}$, and over contacts 320, 322, 324, and 326. For example, the upper surface of dielectric 330 may correspond to level S2 of FIG. 2.

Odd bit lines $BL_{odd1}$ to $BL_{odd4}$ respectively have portions $BL_{odd1,1}$ to $BL_{odd4,1}$ (e.g., that may be called odd portions) and portions $BL_{odd1,2}$ to $BL_{odd4,2}$ (e.g., that may be called even portions). In FIG. 3B, the odd and even drain select gates $SGD_{odd}$ and $SGD_{even}$ and the contacts 320, 322, 324, and 326 are shown using dashed lines for providing a frame of reference for the structure to be added in FIG. 3B. The source and drain regions are omitted from FIG. 3B for clarity.

The odd portions of odd bit lines $BL_{odd}$ may be respectively coupled, on a one-to-one basis, to contacts 320, e.g., odd portions $BL_{odd1,1}$ to $BL_{odd4,1}$ respectively of odd bit lines $BL_{odd1}$ to $BL_{odd4}$ may be in direct physical with their respective contacts 320. This respectively couples odd bit lines $BL_{odd}$, on a one-to-one basis, to odd drain regions 302, as shown in FIG. 4 for odd portion $BL_{odd3,1}$ of odd bit line $BL_{odd3}$ and a single odd drain region 302.

Odd portions $BL_{odd1,1}$ to $BL_{odd4,1}$ may be respectively formed substantially vertically (e.g., directly vertically) above contacts 320, on a one-to-one basis, as shown in FIG. 3B and in FIG. 4 for odd portion $BL_{odd3,1}$ of odd bit line $BL_{odd3}$. For example, the odd portions of odd bit lines $BL_{odd}$ may be respectively vertically aligned with contacts 320, on a one-to-one basis, e.g., where a vertically aligned contact 320 and odd bit line $BL_{odd}$, such as odd bit line $BL_{odd3}$, are intersected by the same single vertical plane, such as the vertical plane of FIG. 4. Since contacts 320 may be respectively vertically aligned on a one-to-one basis with odd drain regions 302, as shown in FIG. 3A, it is apparent from FIG. 3B that the odd portions of odd bit lines $BL_{odd}$ may be vertically aligned on a one-to-one basis with odd drain regions 302.

The odd portions of odd bit lines $BL_{odd}$ may be misaligned with contacts 322, in that odd portions $BL_{odd1,1}$ to $BL_{odd4,1}$ respectively of odd bit lines $BL_{odd1}$ to $BL_{odd4}$ may be substantially straight (e.g., straight). This means that the odd portions of odd bit lines $BL_{odd}$ are misaligned with odd source regions 304. This is apparent from the absence of odd source regions 304 from FIG. 4.

The odd and even portions of each odd bit line $BL_{odd}$ may be offset from each other, e.g., may be misaligned. For example, odd and even portions $BL_{odd1,1}$ and $BL_{odd1,2}$ may be offset from each other; odd and even portions $BL_{odd2,1}$ and $BL_{odd2,2}$ may be offset from each other; odd and even portions $BL_{odd3,1}$ and $BL_{odd3,2}$ may be offset from each other; and odd and even portions $BL_{odd4,1}$ and $BL_{odd4,2}$ may be offset from each other. For example, centerlines 336 and 337 of odd and even portions $BL_{odd3,1}$ and $BL_{odd3,2}$ may not be collinear and may be offset by a particular distance d. This may be the case for the odd and even portions of each odd bit line $BL_{odd}$. For example, the centerlines of the odd and even portions of each odd bit line may not be collinear and may be offset by the particular distance d.

For some embodiments, the distance d by which centerlines 336 and 337 of the odd and even portions of the odd bit lines are offset may be substantially the same (e.g. that same) as the distance D by which centerlines 310 and 312 of odd drains 302 and odd sources 304 are offset. This means that an even portion of an odd bit line, such as portion $BL_{odd3,2}$ of $BL_{odd3}$, may be intersected by the same vertical plane, such as the vertical plane of FIG. 5, as an odd source 304.

Odd bit lines $BL_{odd1}$ to $BL_{odd4}$ may each include a double bend 338, e.g., forming a portion 339 that connects the offset odd and even portions of the respective odd bit lines $BL_{odd1}$ to $BL_{odd4}$, as shown in FIG. 3B. Each portion 339 provides a transition between the offset odd and even portions of a respective odd bit line.

Odd bit lines $BL_{odd}$ include a conductor 340 generally formed of one or more conductive materials, e.g., of metal, such as aluminum, formed over the upper surface of dielectric 330, as shown in FIGS. 4-6. A protective dielectric cap 342 generally formed of one or more dielectric materials, e.g., of nitride, may be formed over conductor 340, as shown in FIGS. 4-6, and dielectric spacers 344 generally formed of one or more dielectric materials, e.g., of nitride, may be formed on sidewalls of conductor 340 and cap 342, as shown in FIG. 6.

A dielectric 350, e.g., that may follow the same material guidelines as dielectric 330, is then formed over cap 342 and dielectric 330, as shown in FIGS. 4-6. Data lines, such as even bit lines $BL_{even}$ (e.g., even bit lines $BL_{even1}$ to $BL_{even4}$) are formed over an upper surface of dielectric 350, as shown in FIGS. 3C and 4-6. For example, the upper surface of dielectric 350 may correspond to level S1 of FIG. 2.

Even bit lines $BL_{even1}$ to $BL_{even4}$ respectively have portions $BL_{even1,1}$ to $BL_{even4,1}$ (e.g., that may be called odd portions) and portions $BL_{even1,2}$ to $BL_{even4,2}$ (e.g., that may be called even portions). In FIG. 3C, the odd and even drain select gates $SGD_{odd}$ and $SGD_{even}$ and the contacts 320, 322, 324, and 326 are shown using dashed lines for providing a frame of reference for the structure to be added in FIG. 3C. The odd bit lines and source and drain regions are omitted from FIG. 3C for clarity.

Even bit lines $BL_{even}$ may include a conductor 352, e.g., that may follow the same material guidelines as conductor 340 of odd bit lines $B_{odd}$, formed over the upper surface of dielectric 350, as shown in FIGS. 4-6. A protective dielectric cap 354, e.g., that may follow the same material guidelines as dielectric cap 342 over odd bit lines $BL_{odd}$, may be formed over conductor 352, as shown in FIGS. 4-6, and dielectric spacers 356, e.g., that may follow the same material guidelines as dielectric spacers 344 of odd bit lines $BL_{odd}$, may be formed on sidewalls of conductor 352 and cap 354, as shown in FIG. 6.

The odd portions of even bit lines $BL_{even}$ may be respectively formed substantially vertically (e.g., directly vertically) above contacts 320 on a one-to-one basis, as shown in FIG. 3C odd portions of $BL_{even1,1}$ to $BL_{even3,1}$ respectively of even bit lines $BL_{even1}$ to $BL_{even3}$ and in FIG. 4 for odd portion of $BL_{even2,1}$. The odd portions of even bit lines $BL_{even}$ also may be respectively formed substantially vertically (e.g., directly vertically) above odd portions of odd bit lines $BL_{odd}$, on a one-to-one basis, as apparent from FIG. 3C in conjunction with FIG. 3B and as shown for odd portions $BL_{even2,1}$ and $BL_{odd3,1}$ respectively of even bit line $BL_{even2}$ and odd bit line $BL_{odd3}$ in FIG. 4. For example, the odd portions of even bit lines $BL_{even}$ may be respectively vertically aligned with the odd portions of odd bit lines $BL_{odd}$, e.g., where vertically aligned odd portions $BL_{even2,1}$ and $BL_{odd3,1}$ are intersected by the same single vertical plane, such as the vertical plane of FIG. 4.

The odd and even portions of each even bit line $BL_{even}$ may be offset from each other, e.g., may be misaligned. For example, odd and even portions $BL_{even1,1}$ and $BL_{even1,2}$ may be offset from each other; odd and even portions $BL_{even2,1}$ and $BL_{even2,2}$ may be offset from each other; and odd and even portions $BL_{even3,1}$ and $BL_{even3,2}$ may be offset from each other. For example, centerlines 357 and 358 of portions $BL_{even3,1}$ and $BL_{even3,2}$ may not be collinear and may be offset by a particular distance d'. This may be the case for the odd and even portions of each even bit line $BL_{even}$. For example, the centerlines of the odd and even portions of each even bit line may not be collinear and may be offset by the particular distance d'.

For some embodiments, the distance d' by which centerlines 357 and 358 of the odd and even portions of the even bit lines are offset may be substantially the same (e.g. the same) as the distance d by which centerlines 336 and 337 of the odd and even portions of the odd bit lines are offset and thus the distance D by which centerlines 310 and 312 of odd drains 302 and odd sources 304 are offset.

The even bit lines may each include a double bend 359, forming a portion 360 that connects the offset odd and even portions of the respective even bit lines. Each portion 360 provides a transition between the offset odd and even portions of a respective even bit line.

The nominal slopes of portions 339 of the odd bit lines $BL_{odd}$ and portions 360 of even bit lines $BL_{even}$ may be substantially the same, but the nominal slopes of portions 339 and 360 may have opposite signs. For example, portions 339 of the odd bit lines $BL_{odd}$ slope downward (e.g., negative nominal slope) from left to right in FIG. 3B, whereas portions 360 of even bit lines $BL_{even}$ slope upward (e.g., positive nominal slope) from left to right in FIG. 3C. As such, a portion 339 of an odd bit line $BL_{odd}$ and a portion 360 of an even bit line $BL_{even}$ may cross each other. This causes the odd and even portions of an even bit line to be respectively vertically aligned with and over an odd portion of one odd bit line and an even portion of another odd bit line.

For example, odd portion $BL_{even1,1}$ of even bit line $BL_{even1}$ is vertically aligned with and over odd portion $BL_{odd2,1}$ of odd bit line $BL_{odd2}$, as is apparent from FIG. 3C in conjunction with FIG. 3B, whereas even portion $BL_{even1,2}$ of even bit line $BL_{even1}$ is vertically aligned with and over even portion $BL_{odd1,2}$ of odd bit line $BL_{odd1}$, as is apparent from FIG. 3C in conjunction with FIG. 3B. Note that vertically aligned odd portions $BL_{even1,1}$ and $BL_{odd2,1}$ are intersected by the same single vertical plane and vertically aligned even portions $BL_{even1,2}$ and $BL_{odd1,2}$ are intersected by the same single vertical plane, e.g., that is offset from the vertical plane that intersects vertically aligned odd portions $BL_{even1,1}$ and $BL_{odd2,1}$ by the distance D.

Stated in a different way the odd and even portions of an odd bit line may be respectively vertically aligned with and under an odd portion of one even bit line and an even portion of another even bit line. For example, odd portion $BL_{odd3,1}$ of odd bit line $BL_{odd3}$ is vertically aligned with and under odd portion $BL_{even2,1}$ of even bit line $BL_{even2}$, as shown in FIG. 4 and is apparent from FIG. 3C in conjunction with FIG. 3B, whereas even portion $BL_{odd3,2}$ of odd bit line $BL_{odd3}$ is vertically aligned with and under even portion $BL_{even3,2}$ of even bit line $BL_{even3}$, as shown in FIG. 5 and is apparent from FIG. 3C in conjunction with FIG. 3B. Note that vertically aligned odd portions $BL_{odd3,1}$ and $BL_{even2,1}$ are intersected by the same single vertical plane, such as the vertical plane of FIG. 4, and vertically aligned even portions $BL_{odd3,2}$ and $BL_{even3,2}$ are intersected by the same single vertical plane, such as the vertical plane of FIG. 5, e.g., that is offset from the vertical plane of FIG. 4 by the distance D.

A dielectric 362, e.g., that may follow the same material guidelines as dielectric 330, may be formed over dielectric cap 354 of the even bit lines $BL_{even}$ and over dielectric 350 and may be planarized, e.g., by chemical mechanical planarization (CMP), so that its upper surface is substantially flush (e.g., flush) with the upper surface of dielectric cap 354, as shown in FIG. 4 for the odd portion $BL_{even2,1}$ of even bit line $BL_{even2}$ and FIG. 5 for the even portion $BL_{even3,2}$ of even bit line $BL_{even3}$. Openings, e.g., slots, are formed through dielectric 362 stopping on or below upper surfaces of contacts 322, 324, and 326 and an upper surface of dielectric 330, thereby exposing contacts 322, 324, and 326. Source and drain contacts, e.g. odd source contacts $SCON_{odd}$, even source contacts $SCON_{even}$, and even drain contacts $DCON_{even}$, are then formed within the openings from a conductor 365, as shown in FIGS. 3C, 4, 5, and 6. Conductor 365 may generally be formed of one or more conductive materials and may comprise, consist of, or consist essentially of conductively doped polysilicon and/or may comprise, consist of, or consist essentially of metal, such as a refractory metal, or a metal-containing material, such as a refractory metal silicide layer, as well as other conductive materials.

For example, conductor 365 may be formed over dielectric 362 so as to overfill the openings. Conductor 365 may be planarized, e.g., by CMP, so that the upper surfaces of odd source contacts $SCON_{odd}$, even source contacts $SCON_{even}$, and even drain contacts $DCON_{even}$ are substantially flush (e.g., flush) with the upper surface of dielectric 362 and the upper surfaces of dielectric caps 354.

Odd source contacts $SCON_{odd}$, even source contacts $SCON_{even}$, and even drain contacts $DCON_{even}$ may be respectively coupled to (e.g., by direct physical contact with) contacts 322, 324, and 326, as shown in FIGS. 3C, 4, 5 and 6. Odd source contacts $SCON_{odd}$ may be vertically aligned with and over contacts 322 on a one-to-one basis; even source contacts $SCON_{even}$ may be vertically aligned with and over contacts 324 on a one-to-one basis; and even drain contacts $DCON_{even}$ may be vertically aligned with and over contacts 326 on a one-to-one basis, e.g., where a vertically aligned odd source contact $SCON_{odd}$ and contact 322 are intersected by the same vertical plane, such as the vertical plane of FIG. 5, a vertically aligned even source contact $SCON_{even}$ and contact 324 are intersected by the same vertical plane, such as the vertical plane of FIG. 4, and a vertically aligned even drain contact and contact 326 are intersected by the same vertical plane, such as the vertical plane of FIG. 4.

Contacts 322 electrically (e.g., and physically) couple odd source contacts $SCON_{odd}$ to odd source regions 304 on a one-to-one basis, as is apparent from FIG. 3A in conjunction with FIG. 3C and as shown in FIG. 5 for a single contact 322 and a single odd source contact $SCON_{odd}$. Odd source contacts $SCON_{odd}$ may be vertically aligned with and over odd source regions 304 and contacts 322 on a one-to-one basis.

Contacts 324 electrically (e.g., and physically) couple even source contacts $SCON_{even}$ to even source regions 306 on a one-to-one basis, as is apparent from FIG. 3A in conjunction with FIG. 3C and as shown in FIG. 4 for a single contact 324 and a single even source contact $SCON_{even}$. Even source contacts $SCON_{even}$ may be vertically aligned with and over even source regions 306 and contacts 324 on a one-to-one basis.

Where even source contacts $SCON_{even}$ are vertically aligned with and over even source regions 306 and contacts 324 and odd source contacts $SCON_{odd}$ are vertically aligned with and over odd source regions 304 and contacts 322, even source contacts $SCON_{even}$ and odd source contacts $SCON_{odd}$ may be offset from (e.g., misaligned with) each other by substantially the same (e.g., the same) distance (e.g., the distance D) by which contacts 322 and 324 are offset from each other and by which odd and even source regions 304 and 306 are offset from each other. For example, the centerlines 366 and 367 respectively of odd source contacts $SCON_{odd}$ and even source contacts $SCON_{odd}$ are offset from each other (e.g., misaligned by) the distance D. That is, the even source contact $SCON_{even}$ of FIG. 4 and the odd source contact $SCON_{odd}$ of FIG. 5 may be offset from each other (e.g., misaligned by) the distance D.

Contacts 326 electrically (e.g., and physically) couple even drain contacts $DCON_{even}$ to even drain regions 308 on a one-to-one basis, as is apparent from FIG. 3A in conjunction with FIG. 3C and as shown in FIGS. 4 and 6 for a single contact 326 and a single even drain contact $DCON_{even}$. Even drain contacts $DCON_{even}$ may be vertically aligned with and over even source regions 308 on a one-to-one basis, as shown in FIG. 6, e.g., a vertically aligned drain contact $DCON_{even}$ and even source region 308 are intersected by the same vertical plane, such as the vertical plane of FIG. 4.

FIG. 6 shows that the even drain contacts $DCON_{even}$, and thus the openings in which even drain contacts $DCON_{even}$ are formed, are interposed between the dielectric spacers 356 formed on the sidewalls of successively adjacent even portions respectively of successively adjacent even bit lines $BL_{even}$, such as successively adjacent even portions $BL_{even3,2}$ and $BL_{even2,2}$ respectively of successively adjacent even bit lines $BL_{even3}$ and $BL_{even2}$, and between the dielectric spacers 344 formed on the sidewalls of successively adjacent even portions respectively of successively adjacent odd bit lines $BL_{odd}$, such as successively adjacent even portions $BL_{odd3,2}$ and $BL_{odd2,2}$ respectively of successively adjacent odd bit lines $BL_{odd3}$ and $BL_{odd2}$. The openings and thus even drain contacts $DCON_{even}$ may self align to the dielectric spacers 356 and dielectric spacers 344. For example, dielectric spacers 356 and dielectric spacers 344 align even drain contacts $DCON_{even}$ with even drain regions 308.

Even source contacts $SCON_{even}$, and thus the openings in which source drain contacts $SCON_{even}$ are formed (not shown), may be similarly interposed between the dielectric spacers 356 formed on the sidewalls of successively adjacent even portions respectively of successively adjacent even bit lines $BL_{even}$ and between the dielectric spacers 344 formed on the sidewalls of successively adjacent even portions respectively of successively adjacent odd bit lines $BL_{odd}$. The openings and thus even source contacts $SCON_{even}$ may self align to the dielectric spacers 356 and dielectric spacers 344. For example, dielectric spacers 356 and dielectric spacers 344 align even source contacts $SCON_{even}$ with even source regions 306.

Odd source contacts $SCON_{odd}$, and thus the openings in which odd source contacts $SCON_{odd}$ are formed, may be similarly interposed (not shown) between dielectric spacers formed on the sidewalls of successively adjacent odd portions respectively of successively adjacent even bit lines $BL_{even}$ and between dielectric spacers formed on sidewalls of successively adjacent odd portions respectively of successively adjacent odd bit lines $BL_{odd}$. The openings and thus odd source contacts $SCON_{odd}$ may self align to the dielectric spacers, so that source contacts $SCON_{odd}$ align with odd source regions 304.

An opening may then be formed through dielectric cap 354 (e.g., using a selective etch, such as a nitride etch) over the even portion of each even bit line (e.g., even portions $BL_{even1,2}$ to $BL_{even4,2}$ respectively of even bit lines $B_{even1}$ to $BL_{even4}$), stopping on or below an upper surface of the conductor 352 of the respective even portion of the respective even bit line and exposing a portion of a sidewall of an adjacent even drain contact $DCON_{even}$. A conductor (e.g., a conductive strap) 370 may then be formed in each opening, as shown in FIGS. 3C, 5, and 6. The conductive strap 370 electrically (e.g., and physically) couples the conductor 352 to the adjacent even drain contact $DCON_{even}$ and may extend laterally from even drain contact $DCON_{even}$ to conductor 352, e.g., conductive strap 370 may extend in a direction substantially perpendicularly (e.g., perpendicularly) to the planes of FIGS. 4 and 5 and thus to even drain contact $DCON_{even}$. This electrically couples the respective contact 326 and thus the respective even drain region 308 to the respective even bit line $B_{even}$, as shown in FIG. 6 for even portion $BL_{even3,2}$ of even bit line $B_{even3}$. The series of conductor 370, conductor 365 (even drain contact $DCON_{even}$), and contact 326 can be viewed as a conductor (e.g., conductive path) 373 that electrically couples even bit line $B_{even3}$ to the even drain region 308, and thus to the even drain select gate $SGD_{even}$, in FIG. 4.

Conductor 365 may generally be formed of one or more conductive materials and may comprise, consist of, or consist essentially of conductively doped polysilicon and/or may comprise, consist of, or consist essentially of metal, such as a refractory metal, or a metal-containing material, such as a refractory metal silicide layer, as well as other conductive materials.

A dielectric 375, e.g., that may follow the same material guidelines as dielectric 330, may then be formed over dielectric 362, the dielectric caps 354, and thus the even bit lines $BL_{even}$, the odd and even source contacts $SCON_{odd}$ and $SCON_{even}$, and the even drain contacts $DCON_{even}$, as shown in FIGS. 4 and 5. A conductor 378, which may generally be formed of one or more conductive materials, e.g., of metal, such as aluminum, refractory metal, etc., may then be formed over dielectric 375. A semiconductor 380, e.g., that may follow the same material guidelines as semiconductor 300, is then formed over (e.g., coupled to, such as in direct physical contact with) conductor 378. The upper surface of semiconductor 380 may correspond to level L1 of FIG. 2.

Openings may then be formed through semiconductor 380, conductor 378, and dielectric 375, e.g., by etching, stopping on or below an upper surface of the odd and even source contacts $SCON_{odd}$ and $SCON_{even}$. Additional conductor 378 may be removed, e.g., using an isotropic etch that is selective to conductor 378, as shown in FIGS. 4 and 5. A dielectric 382, which may generally be formed of one or more dielectric materials, may then be formed over conductor 378. For example, dielectric 382 may be an oxide that is thermally grown over conductor 378. Then, a dielectric 384, which may generally be formed of one or more dielectric materials, such as a nitride and/or oxide, is formed within the openings over dielectric 375 and semiconductor 380. Note that some dielectric 384 may also be formed over dielectric 382.

Conductors $386_{odd}$ and $386_{even}$ are formed over dielectric 384 so that conductors $386_{odd}$ and $386_{even}$ pass through semiconductor 380, conductor 378, and dielectric 375, respectively stopping on, within or below the odd and even source contacts $SCON_{odd}$ and $SCON_{even}$. Conductors 386 may generally be formed of one or more conductive materials, and may comprise, consist of, or consist essentially of conductively doped polysilicon and/or may comprise, consist of or consist essentially of metal, such as a refractory metal, or a metal-containing material, such as a refractory metal silicide layer, as well as other conductive materials.

Strings of series coupled memory cells, such as NAND strings $406_{even1L1}$, $406_{even2L1}$, $406_{odd1L1}$, and $406_{odd2L1}$ of memory cells 408, may subsequently be formed over semiconductor 380, as shown in FIGS. 4 and 5. Each memory cell 408 may include a dielectric $410_{L1}$, such as a tunnel dielectric, e.g., a tunnel oxide, formed (e.g., thermally grown) over semiconductor 380. For some embodiments, dielectric 410 may be a contiguous (e.g., continuous) structure over semiconductor 380. Dielectric 410 may generally be formed of one or more dielectric materials.

A charge storage structure 412 may then be formed over dielectric $410_{L1}$. Charge storage structure 412, which may generally be formed of one or more materials collectively capable of storing and releasing a charge, may be a floating gate, a charge trap, etc. An example floating gate may comprise, consist of, or consist essentially of conductively doped polysilicon. An example charge trap may be a dielectric, e.g., a high-dielectric constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or SiON/$Si_3N_4$.

A dielectric 414, e.g., an interlayer dielectric, may be formed over charge storage structure 412 for some embodiments. Dielectric 414 may generally be formed of one or more dielectric materials, e.g., silicon oxide, nitride, oxynitride, oxide-nitride-oxide (ONO), or other dielectric material. For example, dielectric 414 may be a high-dielectric constant (high-K) dielectric, such as alumina, hafnia ($HfO_2$), or zirconia ($ZrO_2$) with a K of about 20, or praeseodymium oxide ($Pr_2O_3$) with a K of about 30.

A control gate 416 is formed over dielectric 414. Control gate 416 may generally be formed of one or more conductive materials and may comprise, consist of, or consist essentially of conductively doped polysilicon and/or may comprise, consist of, or consist essentially of metal, such as a refractory metal, or a metal-containing material, such as a refractory metal silicide layer, as well as other conductive materials.

The memory cells 408 of each of NAND strings $406_{even1L1}$, $406_{even2L1}$, $406_{odd1L1}$, and $406_{odd2L1}$ are coupled in series by source/drain regions $420_{L1}$, e.g., formed in semiconductor 380 after the formation of the memory cells 408. For example, the source/drain regions $420_{L1}$ may have n-type conductivity when semiconductor 380 has p-type conductivity or p-type conductivity when semiconductor 380 has n-type conductivity. Although the example memory cells are described as floating-gate or charge-trap memory cells, other memory cells can be used with various embodiments. For example, ferroelectric memory cells, magnetic memory cells or other memory cells capable of indicating a data value without the use of a charge storage structure could also be used with the array architectures described herein.

NAND strings $406_{even1L1}$ and $406_{odd1L1}$ form a portion of a stacked memory array, such as a portion of level L1 of non-volatile NAND flash memory array $201_1$ of stacked memory array 200 of FIG. 2, and NAND strings $406_{even2L1}$ and $406_{odd2L1}$ form another portion of the stacked memory array, such as a portion of level L1 of non-volatile NAND flash memory array $201_2$ of stacked memory array 200.

A source/drain region $422_{evenL1}$ may be formed in semiconductor 380 between and electrically coupled to the even NAND strings $406_{even1L1}$ and $406_{even2L1}$, as shown in FIG. 4, and a source/drain region $422_{oddL1}$ may be formed in semiconductor 380 between and electrically coupled to the odd NAND strings $406_{odd1L1}$ and $406_{odd2L1}$, as shown in FIG. 5. For example, source/drain regions $422_{evenL1}$ and $422_{oddL1}$ may be formed substantially concurrently (e.g., concurrently) with source/drain regions $420_{L1}$. Source/drain regions $422_{evenL1}$ and $422_{oddL1}$ can have the same conductivity type as source/drain regions 420.

Note that source/drain regions $422_{evenL1}$ and $422_{oddL1}$ are formed so that conductors $386_{even}$ and $386_{odd}$ may respectively pass therethrough, as shown in FIGS. 4 and 5. Dielectric 384, over which conductors $386_{even}$ and $386_{odd}$ are formed, may also pass through source/drain regions $422_{evenL1}$ and $422_{oddL1}$. Note further that source/drain regions $422_{evenL1}$ and $422_{oddL1}$ may be respectively vertically aligned with even source contact $SCON_{even}$ and odd source contact $SCON_{odd}$ and thus respectively with even source region 306 and odd source region 304, e.g., where the vertically aligned source/drain region $422_{evenL1}$, even source contact $SCON_{even}$, and even source region 306 are intersected by the same vertical plane, such as the vertical plane of FIG. 4 and where the vertically aligned source/drain region $422_{oddL1}$, odd source contact $SCON_{odd}$, and odd source region 304 are intersected by the same vertical plane, such as the vertical plane of FIG. 5.

A dielectric 430, e.g., that may follow the same material guidelines as dielectric 330, may then be formed over dielectric 410, NAND strings $406_{even1L1}$, $406_{even2L1}$, $406_{odd1L1}$, and $406_{odd2L1}$, and source/drain regions $420_{L1}$, $422_{evenL1}$, and $422_{oddL1}$. Openings may be formed in dielectric 430, exposing conductors $386_{odd}$ and $386_{even}$ and source/drain regions $422_{evenL1}$ and $422_{oddL1}$. Conductors $435_{even}$ and $435_{odd}$ may be formed within the openings, respectively stopping on, within or below conductors $386_{even}$ and $386_{odd}$ and source/drain regions $422_{evenL1}$ and $422_{oddL1}$. Conductors $435_{even}$ and $435_{odd}$ may follow the same material guidelines as conductors $386_{even}$ and $386_{odd}$.

Source/drain region $422_{evenL1}$ electrically couples conductor $435_{even}$ to even NAND strings $406_{even1L1}$ and $406_{even2L1}$. The series of conductor $386_{even}$, even source contact $SCON_{even}$, and contact 324 electrically couples even source region 306 of even drain select gate $SGD_{even}$ to conductor $435_{even}$ so that even source region 306 is electrically coupled to even NAND strings $406_{even1L1}$ and $406_{even2L1}$. An even bit line, such as even bit line $BL_{even3}$, is electrically coupled to even drain region 308 by the conductive path 373 (FIG. 6). Therefore, even drain select gate $SGD_{even}$ selectively couples even bit line $BL_{even3}$ to even NAND strings $406_{even1L1}$ and $406_{even2L1}$.

Source/drain region $422_{oddL1}$ electrically couples conductor $435_{odd}$ to odd NAND strings $406_{odd1L1}$ and $406_{odd2L1}$. The series of conductor $386_{odd}$, odd source contact $SCON_{odd}$, and contact 322 electrically couples odd source region 304 of odd drain select gate $SGD_{odd}$ to conductor $435_{odd}$ so that odd source region 304 of odd drain select gate $SGD_{odd}$ is electrically coupled to odd NAND strings $406_{odd1L1}$ and $406_{odd2L1}$ (FIG. 5). An odd bit line, such as odd bit line $BL_{odd3}$, is electrically coupled to an odd drain region 302 of odd drain select gate $SGD_{odd}$ by a contact 320, as shown in FIGS. 3C and 4. Therefore, odd drain select gate $SGD_{odd}$ selectively couples odd bit line $BL_{odd3}$ to odd NAND strings $406_{odd1L1}$ and $406_{odd2L1}$.

A dielectric 450, e.g., that may follow the same material guidelines as dielectric 330, may then be formed over dielectric 430 and conductors 435, as shown in FIGS. 4 and 5. A conductor 452, which may generally be formed of one or more conductive materials, e.g., of metal, such as aluminum, refractory metal, etc., may be formed over dielectric 450. A semiconductor 455, e.g., that may follow the same material guidelines as semiconductor 300, may then be formed over (e.g., coupled to, such as in direct physical contact with) conductor 452. The upper surface of semiconductor 455 may correspond to level L2 of FIG. 2.

Openings may then be formed through semiconductor 455, conductor 452, and dielectric 450, e.g., by etching, stopping on, within or below conductors $435_{odd}$ and $435_{even}$. Additional conductor 452 may be removed, e.g., using an isotropic etch that is selective to conductor 452, as shown in FIGS. 4 and 5. A dielectric 460 may then be formed over conductor 452. For example, dielectric 460 which may generally be formed of one or more dielectric materials, may be an oxide that is thermally grown over conductor 452. Then, a dielectric 465, which may generally be formed of one or more dielectric materials, such as a nitride and/or oxide, may be formed within the openings over dielectric 450 and semiconductor 455. Note that some dielectric 465 may also be formed over dielectric 460.

Conductors $470_{odd}$ and $470_{even}$ are then formed over dielectric 465 so that conductors $470_{odd}$ and $470_{even}$ pass through semiconductor 455, conductor 452, and dielectric 450, respectively stopping on, within or below conductors $435_{odd}$ and $435_{even}$. Conductors $470_{odd}$ and $470_{even}$ may generally be formed of one or more conductive materials and may comprise, consist of, or consist essentially of conductively doped polysilicon and/or may comprise, consist of, or consist essentially of metal, such as a refractory metal, or a metal-containing material, such as a refractory metal silicide layer, as well as other conductive materials.

Strings of series coupled memory cells, such as NAND strings $406_{even1L2}$, $406_{even2L2}$, $406_{odd1L2}$, and $406_{odd2L2}$ of memory cells 408, may subsequently be formed over semiconductor 455, as shown in FIGS. 4 and 5. For some embodiments, dielectric $410_{L2}$, e.g., of that same material as dielectric $410_{L1}$, may be a contiguous (e.g., continuous) structure over semiconductor 455.

The memory cells 408 of each of NAND strings $406_{even1L1}$, $406_{even2L2}$, $406_{odd1L2}$, and $406_{odd2L2}$ are coupled in series by source/drain regions $420_{L2}$, e.g., formed in semiconductor 455 after the formation of the memory cells 408. For example, the source/drain regions $420_{L2}$ may have n-type conductivity when semiconductor 455 has p-type conductivity or p-type conductivity when semiconductor 455 has n-type conductivity.

NAND strings $406_{even1L2}$ and $406_{odd1L2}$ form a portion of a stacked memory array, such as a portion of level L2 of non-volatile NAND flash memory array $201_1$ of stacked memory array 200 of FIG. 2, and NAND strings $406_{even2L2}$ and $406_{odd2L2}$ form another portion of the stacked memory array, such as a portion of level L2 of non-volatile NAND flash memory array $201_2$ of stacked memory array 200.

A source/drain region $422_{evenL2}$ may be formed in semiconductor 455 between and electrically coupled to the even NAND strings $406_{even1L2}$ and $406_{even2L2}$, as shown in FIG. 4, and a source/drain region $422_{oddL2}$ may be formed in semiconductor 455 between and electrically coupled to the odd NAND strings $406_{odd1L2}$ and $406_{odd2L2}$, as shown in FIG. 5. For example, source/drain regions $422_{oddL2}$ and $422_{evenL2}$ may be formed substantially concurrently (e.g., concurrently) with source/drain regions $420_{L2}$. Source/drain regions $422_{oddL2}$ and $422_{evenL2}$ can have the same conductivity type as source/drain regions $420_{L2}$.

Note that source/drain regions $422_{evenL2}$ and $422_{oddL2}$ may be formed so that conductors $470_{even}$ and $470_{odd}$ respectively pass therethrough, as shown in FIGS. 4 and 5. Dielectric 465, over which conductors $470_{even}$ and $470_{odd}$ are formed, may also pass through source/drain regions $422_{evenL2}$ and $422_{oddL2}$. Source/drain regions $422_{evenL2}$ and $422_{oddL2}$ may be respectively vertically aligned with even source contact $SCON_{even}$ and odd source contact $SCON_{odd}$ and thus respectively with even source region 306 and odd source region 304. Source/drain regions $422_{evenL2}$ and $422_{oddL2}$ may also be respectively vertically aligned with source/drain regions $422_{evenL1}$ and $422_{oddL1}$.

A dielectric 475, which may generally be formed of one or more dielectric materials, e.g., that may be of same material as dielectric 330, may then be formed over the dielectric $410_{L2}$, NAND strings $406_{even1L2}$, $406_{even2L2}$, $406_{odd1L2}$, and $406_{odd2L2}$ and source/drain regions $420_{L2}$, $422_{evenL2}$, and $422_{oddL2}$. Openings may be formed in dielectric 475, exposing conductors $470_{odd}$ and $470_{even}$ and source/drain regions $422_{evenL2}$ and $422_{oddL2}$. Conductors $480_{even}$ and $480_{odd}$ may be formed within the openings, respectively stopping on, within or below conductors $470_{even}$ and $470_{odd}$ and source/drain regions $422_{evenL2}$ and $422_{oddL2}$. Conductors $480_{even}$ and $480_{odd}$ may follow the same material guidelines as conductors $470_{even}$ and $470_{odd}$.

Source/drain region $422_{evenL2}$ electrically couples conductor $480_{even}$ to even NAND strings $406_{even1L2}$ and $406_{even2L2}$. Conductor $470_{even}$ electrically couples conductor $480_{even}$ to conductor $435_{even}$. As indicated above, in conjunction with FIG. 4, even source region 306 of even drain select gate $SGD_{even}$ is electrically coupled to conductor $435_{even}$, meaning that even source region 306 is electrically coupled to even NAND strings $406_{even1L2}$ and $406_{even2L2}$. As further indicated above, even bit line $BL_{even3}$ is electrically coupled to even drain region 308 of even drain select gate $SGD_{even}$. Therefore, even drain select gate $SGD_{even}$ selectively couples even bit line $BL_{even3}$ to even NAND strings $406_{even1L2}$ and $406_{even2L2}$, in addition to even NAND strings $406_{even1L1}$ and $406_{even2L1}$.

Source/drain region $422_{oddL2}$ electrically couples conductor $480_{odd}$ to odd NAND strings $406_{odd1L1}$ and $406_{oddL2}$. Conductor $470_{odd}$ electrically couples conductor $480_{odd}$ to conductor $435_{odd}$. As indicated above, in conjunction with FIG. 5, an odd source region 304 of odd drain select gate $SGD_{odd}$ is electrically coupled to conductor $435_{odd}$, meaning that odd source region 304 of odd drain select gate $SGD_{odd}$ is electrically coupled to odd NAND strings $406_{odd1L2}$ and $406_{odd2L2}$. As further indicated above, in conjunction with FIGS. 3C and 4, odd bit line $BL_{odd3}$ is electrically coupled to an odd drain region 302 of odd drain select gate $SGD_{odd}$. Therefore, odd drain select gate $SGD_{odd}$ selectively couples odd bit line $BL_{odd3}$ to odd NAND strings $406_{odd1L2}$ and $406_{odd2L2}$, in addition to odd NAND strings $406_{odd1L1}$ and $406_{odd2L1}$.

In FIG. 4, the series of contact 324, even source contact $SCON_{even}$, conductor $386_{even}$, conductor $435_{even}$, conductor $470_{even}$, and conductor $480_{even}$ can be viewed as a substantially vertical (e.g., vertical) conductor (e.g., conductive path) $485_{even}$. Even source region 306 of even drain select gate $SGD_{even}$ and source/drain regions $422_{evenL1}$ and $422_{evenL2}$, and thus even NAND strings $406_{evenL1}$ and $406_{evenL2}$, are commonly electrically coupled to conductive path $485_{even}$. In FIG. 5, the series of contact 322, odd source contact $SCON_{odd}$, conductor $386_{odd}$, conductor $435_{odd}$, conductor $470_{odd}$, and conductor $480_{odd}$ can be viewed as a substantially vertical (e.g., vertical) conductor (e.g., conductive path) $485_{odd}$. Odd source region 304 of odd drain select gate $SGD_{odd}$ and source/drain regions $422_{oddL1}$ and $422_{oddL2}$, and thus odd NAND strings $406_{oddL1}$ and $406_{oddL2}$, are commonly electrically coupled to conductive path $485_{odd}$. Conductive paths $485_{even}$ and $485_{odd}$ may be offset by the distance D.

For some embodiments, the pitch of the odd/even NAND strings (e.g., the center-to-center distance between successively adjacent odd and even NAND strings $406_{odd}$ and $406_{even}$, such as between NAND strings $406_{odd1L1}$ and $406_{even1L1}$, between NAND strings $406_{odd2L1}$ and $406_{even2L1}$, between NAND strings $406_{odd1L2}$ and $406_{even1L2}$, and between NAND strings $406_{odd2L2}$ and $406_{even2L2}$) is about one half of the pitch $P_{BLodd}$ (e.g., the center-to-center distance between successively adjacent odd bit lines, such as between odd bit lines $BL_{odd3}$ and $BL_{odd4}$, FIG. 3B) and the pitch $P_{BLeven}$ (e.g., the center-to-center distance between successively adjacent even bit lines, such as between odd bit lines $BL_{even1}$ and $BL_{even2}$, FIG. 3C). Note that the pitch $P_{BLodd}$ and the pitch $P_{BLeven}$ may be substantially the same (e.g., the same).

The even NAND strings $406_{even1L1}$ and $406_{even2L1}$ and even NAND strings $406_{even1L2}$, $406_{even2L2}$ in FIG. 4 may be substantially vertically (e.g., vertically) aligned with and electrically coupled to the even source contact $SCON_{even}$, the contact 324, and the even source region 306 in FIG. 4 that are electrically coupled to each other. The odd NAND strings $406_{odd1L1}$, $406_{odd2L1}$ and odd NAND strings $406_{odd1L2}$, $406_{odd2L2}$ in FIG. 5 may be substantially vertically (e.g., vertically) aligned with and electrically coupled to the odd source contact $SCON_{odd}$, the contact 322, and the odd source region 304 in FIG. 5 that are electrically coupled to each other.

Even NAND strings $406_{even}$, source/drain regions $422_{evenL1}$ and $422_{evenL2}$, an even source contact $SCON_{even}$, an even drain contact $DCON_{even}$, a contact 324, an even source region 306, an even drain region 308, a contact 302, an odd drain region 302, and conductive path $485_{even}$ may be intersected by the same single vertical plane of FIG. 4. Odd NAND strings $406_{odd}$, source/drain regions $422_{oddL1}$ and $422_{oddL2}$, odd source contact $SCON_{odd}$, a contact 322, an odd source region 304 and conductive path $485_{odd}$ may be intersected by the same single vertical plane of FIG. 5, where vertical planes of FIGS. 4 and 5 are separated (e.g., offset) by the distance D, e.g., that may be about the same (e.g., the same) as the pitch of odd/even NAND strings $406_{odd}$/$406_{even}$. In particular, note that an odd drain region 302 and odd source region 304 are respectively intersected by the same vertical planes that intersect an even NAND string $406_{even}$ and an even NAND string $406_{odd}$.

The distance D by which the odd source region 304 in FIG. 5 and even source region 306 in FIG. 4 are offset (see FIG. 3A), by which contact 322 in FIG. 5 and contact 324 in FIG. 4 are offset (see FIG. 3A), and by which the odd source contact $SCON_{odd}$ in FIG. 5 and even source contact $SCON_{even}$ in FIG. 4 are offset (see FIG. 3C) may be substantially equal to the pitch of the odd/even NAND strings. The offset allows for the vertical alignment of the source/drain regions $422_{oddL1}$ and $422_{oddL2}$, and thus the vertical alignment of odd NAND strings $406_{odd}$ in FIG. 5 with the odd source contact $SCON_{odd}$, the contact 322, and the odd source region 304 in FIG. 5, e.g., the offset allows for the vertical alignment of odd conductive path $485_{odd}$ with odd NAND strings $406_{odd}$ and odd source region 304, and thus facilitates the coupling of the odd drain select gate $SGD_{odd}$, and thereby the odd bit line $BL_{odd3}$, to the odd NAND strings $406_{odd}$. The offset also allows for the vertical alignment of the source/drain regions $422_{evenL1}$ and $422_{evenL2}$, and thus the vertical alignment of even NAND strings $406_{even}$ in FIG. 4 with the even source contact $SCON_{even}$, the contact 324, and the even source region 306 in FIG. 4, e.g., the offset allows for the vertical alignment of even conductive path $485_{even}$ with even NAND strings $406_{even}$ and even source region 306, and thus facilitates the coupling of the even drain select gate $SGD_{even}$, and thereby the even bit line $BL_{even3}$, to the even NAND strings $406_{even}$.

Forming the odd and even bit lines at different vertical levels in the memory array and respectively coupling the odd and even bit lines to odd and even source contacts $SCON_{odd}$ and $SCON_{even}$ that are offset by the distance D, e.g., substantially equal to the pitch of the odd/even NAND strings, and that are respectively vertically aligned with the odd NAND strings $406_{odd}$ and the even NAND strings $406_{even}$ allows the odd and even bit lines have a greater pitch than (e.g., about twice the pitch of) the odd/even NAND strings. This enables the odd and even bit lines to be wider than they would otherwise be if they were formed over the respective odd and even NAND strings, causing the pitch of the odd/even bit lines to have about the same pitch as the odd/even NAND strings, as is common in the prior art. For example, the reduced pitch would result in narrower bit lines. Wider bit lines have a lower resistance and thus a reduced delay (e.g., reduced RC time constant).

The odd NAND strings $406_{odd}$ and the even NAND strings $406_{even}$ respectively in FIGS. 5 and 4 form a pair of odd/even NAND strings 406. The bit lines $BL_{odd3}$ and $BL_{even3}$ form a pair of bit lines $BL_{odd3}/BL_{even3}$ that corresponds to the pair of odd/even NAND strings 406, where bit line $BL_{odd3}$ is coupled to the odd NAND strings $406_{odd}$ of the pair of odd/even NAND strings 406, and bit line $BL_{even3}$ is coupled to the even NAND strings $406_{even}$ of the pair of odd/even NAND strings 406. The first portion $BL_{odd3,1}$ of bit line $BL_{odd3}$ is vertically aligned with the even NAND strings $406_{even}$ (FIG. 4), and the second portion $BL_{odd3,2}$ of bit line $BL_{odd3}$ is vertically aligned with the odd NAND strings $406_{odd}$ (FIG. 5). The second portion $BL_{even3,2}$ of bit line $BL_{even3}$ is vertically aligned with the odd NAND strings $406_{odd}$ and with the second portion $BL_{odd3,2}$ of bit line $BL_{odd3}$ (FIG. 5). The first portion $BL_{even3,1}$ of bit line $BL_{even3}$ is vertically aligned with the even NAND strings of another pair of odd/even NAND strings (not shown).

Note that there are a plurality of such pairs of odd/even NAND strings and corresponding pairs of bit lines. For example, bit lines $BL_{odd2}/BL_{even2}$ corresponds to an other pair of odd/even NAND strings (not shown), where bit line $BL_{odd2}$ is coupled to an odd NAND string of the other pair of NAND strings and bit line $BL_{even2}$ is coupled to an even NAND string of the other pair of NAND strings. Note that the first portion $BL_{even2,1}$ of bit line $BL_{even2}$ is vertically aligned with the even NAND strings $406_{even}$ in FIG. 4, but that these NAND strings are not part of the other pair of odd/even NAND strings respectively coupled to bit lines $BL_{odd2}$ and $BL_{even2}$.

An odd drain select gate $SGD_{odd}$ and an even drain select gate $SGD_{even}$ correspond to each pair of odd/even NAND strings and are respectively coupled to the odd and even NAND strings of a corresponding pair of odd/even NAND strings. The first portion $BL_{odd3,1}$ of bit line $BL_{odd3}$ may be vertically aligned with the even NAND strings $406_{even}$ of the corresponding pair of odd/even NAND strings and may be vertically aligned with and coupled to the odd drain region 302 of the corresponding odd drain select gate $SGD_{odd}$ in FIG. 4. The odd source region 304 of the corresponding odd drain select gate $SGD_{odd}$ may be vertically aligned with the odd NAND strings $406_{odd}$ the of the corresponding pair of odd/even NAND strings and coupled thereto in FIG. 5. The even source region 306 and even drain region 308 of the corresponding even drain select gate $SGD_{even}$ may be vertically aligned with the even NAND strings $406_{even}$ of the corresponding pair of odd/even NAND strings, and the even source region 306 of the corresponding even drain select gate $SGD_{even}$ is coupled to the even NAND strings $406_{even}$ of the corresponding pair of odd/even NAND strings.

As indicated above, in conjunction with FIGS. 4 and 5, the source select gates, such as odd source select gates $SGS_{odd,1}$ and $SGS_{odd,2}$ and even $SGS_{even,1}$ and $SGS_{even,2}$, may be formed over (e.g., on) semiconductor 300, e.g., substantially concurrently (e.g., concurrently) with forming odd drain select gates $SGD_{odd}$ and even drain select gates $SGD_{even}$. An odd source select gate $SGS_{odd,1}$ may be coupled to ends of odd NAND strings $406_{odd1L1}$ and $406_{odd1L2}$ that are located opposite to the ends to which odd drain select gate $SGD_{odd,1}$ is coupled. For example, a source/drain (e.g., drain) of odd source select gate $SGS_{odd,1}$, e.g., formed in semiconductor 300 substantially concurrently (e.g., concurrently) with the source/drains of the odd and even drain select gates, may be coupled to source/drains formed in semiconductors 380 and 455 respectively adjacent and coupled to the ends of odd NAND strings $406_{odd1L1}$ and $406_{odd1L2}$ that are located opposite to the ends to which odd drain select gate $SGD_{odd}$ is coupled. The drain of odd source select gate $SGS_{odd,1}$ and odd NAND strings $406_{odd1L1}$ and $406_{odd1L2}$ may be intersected by the same vertical plane, such as the vertical plane of FIG. 5.

An odd source select gate $SGS_{odd,2}$ may be coupled to ends of odd NAND strings $406_{odd2L1}$ and $406_{odd2L2}$ that are located opposite to the ends to which odd drain select gate $SGD_{odd}$ is coupled. For example, a source/drain (e.g., drain) of odd source select gate $SGS_{odd,2}$, e.g., formed in semiconductor 300 substantially concurrently (e.g., concurrently) with the source/drains of the odd and even drain select gates, may be coupled to source/drains formed in semiconductors 380 and 455 respectively adjacent and coupled to the ends of odd NAND strings $406_{odd2L1}$ and $406_{odd2L2}$ that are located opposite to the ends to which odd drain select gate $SGD_{odd}$ is coupled. The drain of odd source select gate $SGS_{odd,2}$ and odd NAND strings $406_{odd2L1}$ and $406_{odd2L2}$ may be intersected by the same vertical plane, such as the vertical plane of FIG. 5. Another source/drain region (e.g., source) of each of odd source select gates $SGS_{odd,1}$ and $SGS_{odd,2}$, e.g., formed in semiconductor 300 substantially concurrently (e.g., concurrently) with the source/drains of the odd and even drain select gates, may be coupled to a source line, such as respectively to source lines $220_1$ and $220_2$ in FIG. 2, e.g., formed in dielectric 330.

An even source select gate $SGS_{even,1}$ may be coupled to ends of even NAND strings $406_{even1L1}$ and $406_{even1L2}$ that are located opposite to the ends to which even drain select gate $SGD_{even}$ is coupled. For example, a source/drain (e.g., drain) of even source select gate $SGS_{even,1}$, e.g., formed in semiconductor 300 substantially concurrently (e.g., concurrently) with the source/drains of the odd and even drain select gates, may be coupled to source/drains formed in semiconductors 380 and 455 respectively adjacent and coupled to the ends of even NAND strings $406_{even1L1}$ and $406_{even1L2}$ that are located opposite to the ends to which even drain select gate $SGD_{even}$ is coupled. The drain of even source select gate $SGS_{even,1}$ and even NAND strings $406_{even1L1}$ and $406_{even1L2}$ may be intersected by the same vertical plane, such as the vertical plane of FIG. 4.

An even source select gate $SGS_{even,2}$ may be coupled to ends of even NAND strings $406_{even2L1}$ and $406_{even2L2}$ that are located opposite to the ends to which even drain select gate $SGD_{even}$ is coupled. For example, a source/drain (e.g., drain) of even source select gate $SGS_{even,2}$, e.g., formed in semiconductor 300 substantially concurrently (e.g., concurrently) with the source/drains of the odd and even drain select gates, may be coupled to source/drains formed in semiconductors 380 and 455 respectively adjacent and coupled to the ends of even NAND strings $406_{even2L1}$ and $406_{even2L2}$ that are located opposite to the ends to which even drain select gate $SGD_{even}$ is coupled. The drain of even source select gate $SGS_{even,2}$ and even NAND strings $406_{even2L1}$ and $406_{even2L2}$ may be intersected by the same vertical plane, such as the vertical plane of FIG. 4. Another source/drain region (e.g., source) of each of even source select gates $SGS_{even,1}$ and $SGS_{even,2}$, e.g., formed in semiconductor 300 substantially concurrently (e.g., concurrently) with the source/drains of the odd and even drain select gates, may be coupled to a source line, such as respectively to source lines $220_1$ and $220_2$.

The drains of the odd source select gates, such as odd source select gates $SGS_{odd,1}$ and $SGS_{odd,2}$, and the even source select gates, such as even source select gates $SGS_{even,1}$ and $SGS_{even,2}$, can be coupled to their respective NAND strings (e.g., the respective source/drains coupled to the ends of those NAND stings opposite to the ends to which the drain select gates are coupled) using conductors (not shown), e.g., that form a conductive paths, that are similar to and formed substantially concurrently (e.g., concurrently) with conductors 485 (FIGS. 4 and 5). For example, each conductor may include a portion that is formed through dielectric 330, e.g., in direct contact with a drain of a respective source select gate, substantially concurrently (e.g., concurrently) with contacts 322 and 324 of conductors $485_{odd}$ and $485_{even}$. Each conductor may include a portion that is formed through dielectrics 350 and 362 substantially concurrently (e.g., concurrently) with odd source contacts $SCON_{odd}$ and even source contacts $SCON_{even}$ of conductors $485_{odd}$ and $485_{even}$. Each conductor may include a portion that is formed through dielectric 375, conductor 378, and semiconductor 380 substantially concurrently (e.g., concurrently) with conductors $386_{odd}$ and $386_{even}$ of conductors $485_{odd}$ and $485_{even}$, where this portion is formed over dielectrics 382 and 384 in substantially the same manner as conductors $386_{odd}$ and $386_{even}$ (FIGS. 4 and 5) and where this portion passes through a source/drain coupled to a respective odd or even NAND string at vertical level L1, such as a respective odd NAND string $406_{odd1L1}$ or $406_{odd2L1}$ or a respective even NAND string $406_{even1L1}$ or $406_{even2L1}$. Each conductor may include a portion that is formed through dielectric 430 substantially concurrently (e.g., concurrently) with conductors $435_{odd}$ and $435_{even}$ of conductors $485_{odd}$ and $485_{even}$. Each conductor may include a portion that is formed through dielectric 450, conductor 452, and semiconductor 455 substantially concurrently (e.g., concurrently) with conductors $470_{odd}$ and $470_{even}$ of conductors $485_{odd}$ and $485_{even}$, where this portion is formed over dielectrics 460 and 465 in substantially the same manner as conductors $470_{odd}$ and $470_{even}$ (FIGS. 4 and 5) and where this portion passes through a source/drain coupled to a respective odd or even NAND string at vertical level L2, such as a respective odd NAND string $406_{odd1L2}$ or $406_{odd2L2}$ or a respective even NAND string $406_{even1L2}$ or $406_{even2L2}$.

Forming the select gates at a different vertical level than the NAND strings and using single select gates for more than one NAND string reduces the number of masks, and thus the processing time, that would otherwise be needed for forming a source and drain select gate at opposite ends of each NAND string, as is commonly done.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
    first and second memory cells at a first vertical level of the memory;
    first and second memory cells at a second vertical level of the memory;
    a first data line selectively coupled to the first memory cells at the first and second vertical levels; and
    a second data line selectively coupled to the second memory cells at the first and second vertical levels;
    wherein the second data line is at a third vertical level below the first and second vertical levels and the first data line is at a fourth vertical level below third vertical level.

2. The memory of claim 1, wherein a portion of the second data line crosses over a portion of the first data line.

3. The memory of claim 1, wherein the first and second memory cells at the first vertical level of the memory are respectively coupled in series with other first and second memory cells at the first vertical level of the memory, and the first and second memory cells at the second vertical level of the memory are respectively coupled in series with other first and second memory cells at the second vertical level of the memory.

4. The memory of claim 1, wherein at least one of the first memory cells and at least one of the second memory cells at the first vertical level of the memory are commonly coupled to a single access line and at least one of the first memory cells and at least one of the second memory cells at the second vertical level of the memory are commonly coupled to another single access line.

5. A memory, comprising:
    first and second memory cells at a first vertical level of the memory;
    first and second memory cells at a second vertical level of the memory;
    a first data line selectively coupled to the first memory cells at the first and second vertical levels;
    a second data line over the first data line and selectively coupled to the second memory cells at the first and second vertical levels; and
    a select gate comprising a first source/drain coupled to the first data line and a second source/drain coupled to the first memory cells at the first and second vertical levels, the first source/drain substantially vertically aligned with the second memory cells at the first and second vertical levels and the second source/drain substantially vertically aligned with the first memory cells at the first and second vertical levels.

6. The memory of claim 5, further comprising source/drains at the first and second vertical levels, the source/drains at the first and second levels respectively coupled to the first memory cells at the first and second vertical levels, the source/drains at the first and second levels and the second source/drain of the select gate commonly coupled to a conductor.

7. The memory of claim 5, wherein a first portion of the first data line is substantially vertically aligned with the first source/drain of the select gate and a second portion of the first data line is offset from the first portion of the first data line.

8. The memory of claim 7, wherein a first portion of the second data line is substantially vertically aligned with the second portion of the first data line and a second portion of the second data line is offset from the first portion of the first data line.

9. The memory of claim 8, wherein the second portion of the second data line is offset from the first portion of the first data line by a center-to-center distance that is about twice a center-to-center distance between the first and second memory cells at the first and second vertical levels.

10. The memory of claim 5, wherein the select gate is a first select gate, and further comprising a second select gate comprising a first source/drain coupled to the second data line and a second source/drain that is coupled to the second memory cells at the first and second vertical levels.

11. The memory of claim 10, wherein the first and second source/drains of the second select gate are substantially vertically aligned with the second memory cells at the first and second vertical levels.

12. The memory of claim 11, further comprising a conductor that couples a portion of second data line that is substantially vertically aligned with the first memory cells to the first source/drain of the second select gate.

13. A memory, comprising:
first and second memory cells at a first vertical level of the memory;
first and second memory cells at a second vertical level of the memory;
a first data line selectively coupled to the first memory cells at the first and second vertical levels;
a second data line over the first data line and selectively coupled to the second memory cells at the first and second vertical levels;
wherein the first and second memory cells at the first vertical level of the memory are formed over a first semiconductor that is formed over a first metal layer and the first and second memory cells at the second vertical level of the memory are formed over a second semiconductor that is formed over a second metal layer that is formed over the first semiconductor.

14. The memory of claim 13, wherein the second data line is located under the first and second vertical levels.

15. A memory, comprising:
a first string of memory cells comprising a plurality of memory cells coupled in series, the plurality of memory cells of the first string coupled in series intersected by a first vertical plane;
a second string of memory cells comprising a plurality of memory cells coupled in series, the plurality of memory cells of the second string coupled in series intersected by a second vertical plane different from the first vertical plane; and
a select gate having first and second source/drains, the first source/drain intersected by the first vertical plane and coupled to the first string of memory cells, the second source/drain intersected by the second vertical plane.

16. The memory of claim 15, wherein at least one memory cell of each of the first and second strings of memory cells is commonly coupled to a single access line.

17. The memory of claim 15, further comprising a data line coupled to the second source/drain of the select gate so that the select gate selectively couples the first string of memory cells to the data line.

18. The memory of claim 17, wherein the data line is under the first and second strings of memory cells.

19. The memory of claim 15, wherein the select gate is a first select gate, and further comprising a second select gate having first and second source/drains intersected by the second vertical plane, the second source/drain of the second select gate coupled to the second strings of memory cells.

20. A memory, comprising:
a first string of memory cells comprising a plurality of memory cells coupled in series, the plurality of memory cells of the first string coupled in series intersected by a first vertical plane;
a second string of memory cells comprising a plurality of memory cells coupled in series, the plurality of memory cells of the second string coupled in series intersected by a second vertical plane different from the first vertical plane;
a select gate having first and second source/drains, the first source/drain intersected by the first vertical plane and coupled to the first string of memory cells, the second source/drain intersected by the second vertical plane; and
a data line coupled to the second source/drain of the select gate;
wherein a portion of the data line is intersected by the first vertical plane and another portion of the data line is intersected by the second vertical plane.

21. The memory of claim 20, wherein the portion of the data line that is intersected by the second vertical plane is coupled to the second source/drain by a contact that is intersected by the second vertical plane.

22. A memory, comprising:
first and second strings of memory cells respectively intersected by first and second vertical planes; and
a first select gate having first and second source/drains, the first source/drain intersected by the first vertical plane and coupled to the first string of memory cells, the second source/drain intersected by the second vertical plane;
a second select gate having first and second source/drains intersected by the second vertical plane, the second source/drain of the second select gate coupled to the second string of memory cells;
a data line having a portion intersected by the first vertical plane; and
a conductor that couples the portion of the data line intersected by the first vertical plane to the first source/drain of the second select gate.

23. The memory of claim 19, wherein the first and second strings of memory cells are located at a first vertical level of the memory, and further comprising first and second strings of memory cells respectively intersected by the first and second vertical planes and located at each of one or more other vertical levels of the memory, the first source/drain of the first select gate coupled to the first strings of memory cells at each of the one or more other vertical levels, the second source/drain of the second select gate coupled to the second strings of memory cells at each of the one or more other vertical levels.

24. A memory, comprising:
first and second strings of memory cells;
first and second data lines respectively coupled to the first string and the second string;
wherein a first portion of the first data line is substantially vertically aligned with the first string of memory cells;
wherein a first portion of the second data line is substantially vertically aligned with the first portion of the first data line;
wherein a second portion of the first data line is offset from the first portion of the first data line and is substantially vertically aligned with the second string of memory cells; and
wherein a second portion of the second data line is offset from the first portion of the second data line.

25. The memory of claim 24, further comprising a select gate that comprises a first/source drain substantially vertically aligned with the first string of memory cells and coupled to the first string of memory cells and a second source/drain substantially vertically aligned with the second string of memory cells and coupled to the second portion of the first data line.

26. The memory of claim 25, wherein the select gate is a first select gate, and further comprising a second select gate that comprises first and second first/source drains substantially vertically aligned with the second string of memory cells, the first source/drain of the second select gate coupled to the second string of memory cells, the second source/drain of the second select gate coupled to the first portion of the second data line.

27. The memory of claim 24, wherein the second data line is located above the first data line and below the corresponding pair of strings of memory cells.

28. A memory, comprising:
a first and a second string of series-coupled memory cells;
a first data line under the first string and the second string of series-coupled memory cells having a first portion that is substantially vertically aligned with the first string of series-coupled memory cells and a second portion that is offset from the first portion;
a second data line over the first data line having a first portion that is substantially vertically aligned with the first portion of the first data line and a second portion that offset from the first portion of the second data line;
a first select gate under the data lines having a first source/drain substantially vertically aligned with the first string of series-coupled memory cells and coupled thereto and having a second/source drain that is substantially vertically aligned with the second string of series-coupled memory cells; and
a second select gate under the data lines having first and second source/drains substantially vertically aligned with the second string of series-coupled memory cells, the first source/drain of the second select gate coupled to the second string of series-coupled memory cells, the second source/drain of the second select gate coupled to the first portion of the second data line.

29. The memory of claim 28, further comprising an access line commonly coupled to a memory cell from each of the first string and the second string of series-coupled memory cells.

30. A method of forming a memory, comprising:
forming a first data line at a first vertical level of the memory;
forming a second data line at a second vertical level of the memory over the first vertical level;
forming first and second memory cells at a third vertical level of the memory over the second vertical level, wherein the first memory cell at the third vertical level is selectively coupled to the first data line and the second memory cell at the third vertical level is selectively coupled to the second data line; and
forming first and second memory cells at a fourth vertical level of the memory over the third vertical level, wherein the first memory cell at the fourth vertical level is selectively coupled to the first data line and the second memory cell at the fourth vertical level is selectively coupled to the second data line.

31. A method of forming a memory, comprising:
forming a first data line at a first vertical level of the memory;
forming a second data line at a second vertical level of the memory over the first vertical level;
forming first and second memory cells at a third vertical level of the memory over the second vertical level, wherein the first memory cell at the third vertical level is selectively coupled to the first data line and the second memory cell at the third vertical level is selectively coupled to the second data line;
forming first and second memory cells at a fourth vertical level of the memory over the third vertical level, wherein the first memory cell at the fourth vertical level is selectively coupled to the first data line and the second memory cell at the fourth vertical level is selectively coupled to the second data line; and before forming the first data line, forming a select gate at a vertical level under the first vertical level, the select gate comprising a first source/drain that is substantially vertically aligned with the first memory cells at the third and fourth vertical levels, and a second source/drain formed in the semiconductor that is substantially vertically aligned with the second memory cells at the third and fourth vertical levels;
wherein the first source/drain is coupled to the first memory cells and the second/source drain is coupled to the first data line.

32. The method of claim 31, wherein the select gate is a first select gate, and further comprising:
before forming the first data line, forming a second select gate at the vertical level at which the first select gate was formed, the second select gate comprising first and second source/drains that are substantially vertically aligned with the second memory cells at the third and fourth vertical levels;
wherein the first source/drain of the second select gate is coupled to the second memory cells and the second/source drain of the second select gate is coupled to the second data line.

33. The method of claim 32, further comprising forming a single access line coupled to the first and second memory cells at the third vertical level to a single access line and forming another single access line that couples the first and second memory cells at the fourth vertical level of the memory.

34. A method of forming a memory, comprising:
forming a first data line at a first vertical level of the memory;
forming a second data line at a second vertical level of the memory over the first vertical level;
forming first and second memory cells at a third vertical level of the memory over the second vertical level, wherein the first memory cell at the third vertical level is selectively coupled to the first data line and the second memory cell at the third vertical level is selectively coupled to the second data line; and
forming first and second memory cells at a fourth vertical level of the memory over the third vertical level, wherein the first memory cell at the fourth vertical level is selectively coupled to the first data line and the second memory cell at the fourth vertical level is selectively coupled to the second data line;
wherein forming the first memory cell comprises forming the first memory cell to substantially vertically align with a first portion of the first data line, wherein forming the second memory cell comprises forming the second memory cell to substantially vertically align with a second portion of the first data line.

35. The method of claim 34, further comprising forming the first memory cell to substantially vertically align with a first portion of the second data line and wherein forming the second data line comprises forming a second portion of the second data line to be offset from the first portion of the second data line.

36. A method of forming a memory, comprising:
forming first and second select gates adjacent to a first semiconductor;
forming a first source/drain of the first select gate and first and second source/drains of the second select gate so that the first source/drain of the first select gate and first and second source/drains of the second select gate are intersected by a first vertical plane;

forming a second source/drain of the first select gate so that the second source/drain of the first select gate is intersected by a second vertical plane that is offset from the first vertical plane;

forming a first data line over the first and second select gates, the first data line having a first portion intersected by the first vertical plane and a second portion intersected the second vertical plane;

forming a contact interposed between the first portion of the first data line and the first source/drain of the first select gate that couples the first portion of the first data line to the first source/drain of the first select gate;

forming a second data line over the first data line, the second data line having a first portion that is offset from the first portion of the first data line and a second portion that is intersected by the second vertical plane;

forming a first conductor that couples the second portion of the second data line to the second source/drain of the second select gate;

forming a second semiconductor over the second data line;

forming first and second strings of series-coupled memory cells over the second semiconductor, the first and second strings of series-coupled memory cells respectively intersected by the first and second vertical planes;

forming a second conductor intersected by the first vertical plane that couples the first string of series-coupled memory cells to the first source/drain of the second select gate; and forming a third conductor intersected by the second vertical plane that couples second string of series-coupled memory cells to the second source/drain of the first select gate.

37. The method of claim 36, further comprising forming a metal conductor over the first semiconductor and forming the second semiconductor over the metal conductor.

38. The method of claim 36, wherein forming the first conductor comprises:

forming a first portion of the first conductor that is intersected by the first plane and that is coupled to the second source/drain of the second select gate; and forming a second portion of the first conductor that is coupled to the first portion of the first conductor and that extends in a direction that is substantially perpendicular to the first and second planes.

* * * * *

UNITED STATES PATENT AND TRADEMARK OFFICE
CERTIFICATE OF CORRECTION

PATENT NO. : 8,446,767 B2
APPLICATION NO. : 12/829860
DATED : May 21, 2013
INVENTOR(S) : Sanh D. Tang et al.

It is certified that error appears in the above-identified patent and that said Letters Patent is hereby corrected as shown below:

On Title Page, Item (56), under "Other Publications", column 1, line 4, delete "Indluding" and insert -- Including --, therefor.

In the Claims

In column 28, line 57, in Claim 25, delete "first/source drain" and insert -- first source/drain --, therefor.

In column 28, line 65, in Claim 26, delete "first/source drain" and insert -- first source/drain --, therefor.

In column 29, line 21, in Claim 28, delete "second/source drain" and insert -- second source/drain --, therefor.

In column 30, line 10, in Claim 28, delete "second/source drain" and insert -- second source/drain --, therefor.

In column 30, lines 22-23, in Claim 28, delete "second/source drain" and insert -- second source/drain --, therefor.

Signed and Sealed this
Sixteenth Day of July, 2013

Teresa Stanek Rea
*Acting Director of the United States Patent and Trademark Office*